(12) United States Patent
Wang et al.

(10) Patent No.: US 11,990,418 B2
(45) Date of Patent: May 21, 2024

(54) CHIP PACKAGE STRUCTURE WITH BUFFER STRUCTURE AND METHOD FOR FORMING THE SAME

(71) Applicant: Taiwan Semiconductor Manufacturing Company, Ltd., Hsinchu (TW)

(72) Inventors: Chin-Hua Wang, New Taipei (TW); Po-Chen Lai, Hsinchu County (TW); Ping-Tai Chen, Taipei (TW); Che-Chia Yang, Taipei (TW); Yu-Sheng Lin, Chupei (TW); Po-Yao Lin, Hsinchu County (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 249 days.

(21) Appl. No.: 17/459,266

(22) Filed: Aug. 27, 2021

(65) Prior Publication Data

US 2023/0061932 A1 Mar. 2, 2023

(51) Int. Cl.
| | | |
|---|---|---|
| *H01L 23/48* | (2006.01) | |
| *H01L 21/48* | (2006.01) | |
| *H01L 21/60* | (2006.01) | |
| *H01L 21/768* | (2006.01) | |
| *H01L 23/00* | (2006.01) | |
| *H01L 23/538* | (2006.01) | |
| *H01L 25/065* | (2023.01) | |

(52) U.S. Cl.
CPC ........ *H01L 23/5384* (2013.01); *H01L 21/486* (2013.01); *H01L 21/60* (2021.08); *H01L 21/76802* (2013.01); *H01L 24/80* (2013.01); *H01L 25/0655* (2013.01)

(58) Field of Classification Search
CPC . H01L 21/56; H01L 21/486; H01L 21/76802; H01L 23/28; H01L 23/5384; H01L 25/0657
USPC ........................................................ 257/774
See application file for complete search history.

(56) References Cited

U.S. PATENT DOCUMENTS

| | | | | | |
|---|---|---|---|---|---|
| 5,963,429 | A | * | 10/1999 | Chen | H01L 25/0657 361/764 |
| 6,501,175 | B2 | * | 12/2002 | Yamashita | H01L 23/36 257/E23.101 |
| 6,709,897 | B2 | * | 3/2004 | Cheng | H01L 24/05 438/126 |

(Continued)

*Primary Examiner* — Nitin Parekh
(74) *Attorney, Agent, or Firm* — McClure, Qualey & Rodack, LLP

(57) ABSTRACT

A method for forming a chip package structure is provided. The method includes removing a first portion of a substrate to form a first recess in the substrate. The method includes forming a buffer structure in the first recess. A first Young's modulus of the buffer structure is less than a second Young's modulus of the substrate. The method includes forming a first wiring structure over the buffer structure and the substrate. The method includes bonding a chip package to the first wiring structure. The chip package has an interposer substrate and a chip structure over the interposer substrate, and a first corner of the interposer substrate and a second corner of the chip structure overlap the buffer structure in a top view of the chip package and the buffer structure.

20 Claims, 38 Drawing Sheets

(56) References Cited

U.S. PATENT DOCUMENTS

| | | | |
|---|---|---|---|
| 2003/0141105 A1* | 7/2003 | Sugaya | H01L 21/56 |
| | | | 257/E23.125 |
| 2011/0316147 A1* | 12/2011 | Shih | H01L 23/147 |
| | | | 257/737 |
| 2012/0048607 A1* | 3/2012 | Takahashi | H01L 21/563 |
| | | | 174/260 |
| 2020/0006242 A1* | 1/2020 | Jee | H01L 21/4857 |
| 2020/0098692 A1* | 3/2020 | Liff | H01L 23/5386 |
| 2020/0266172 A1* | 8/2020 | Nishimura | H01L 24/92 |

* cited by examiner

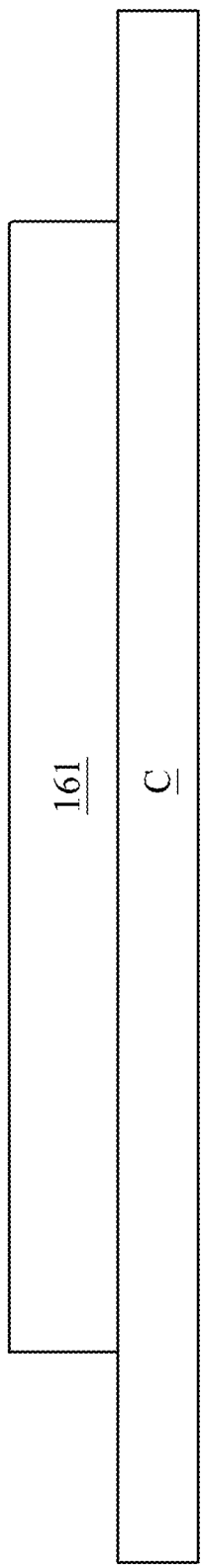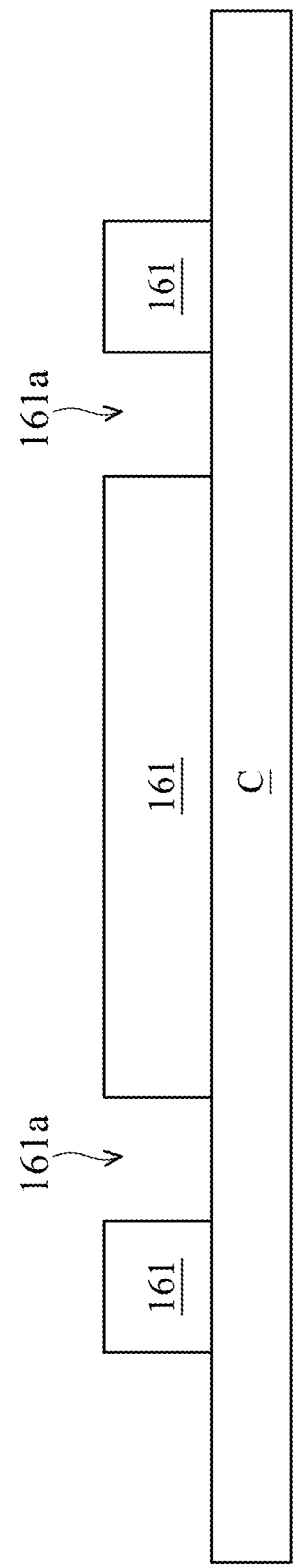

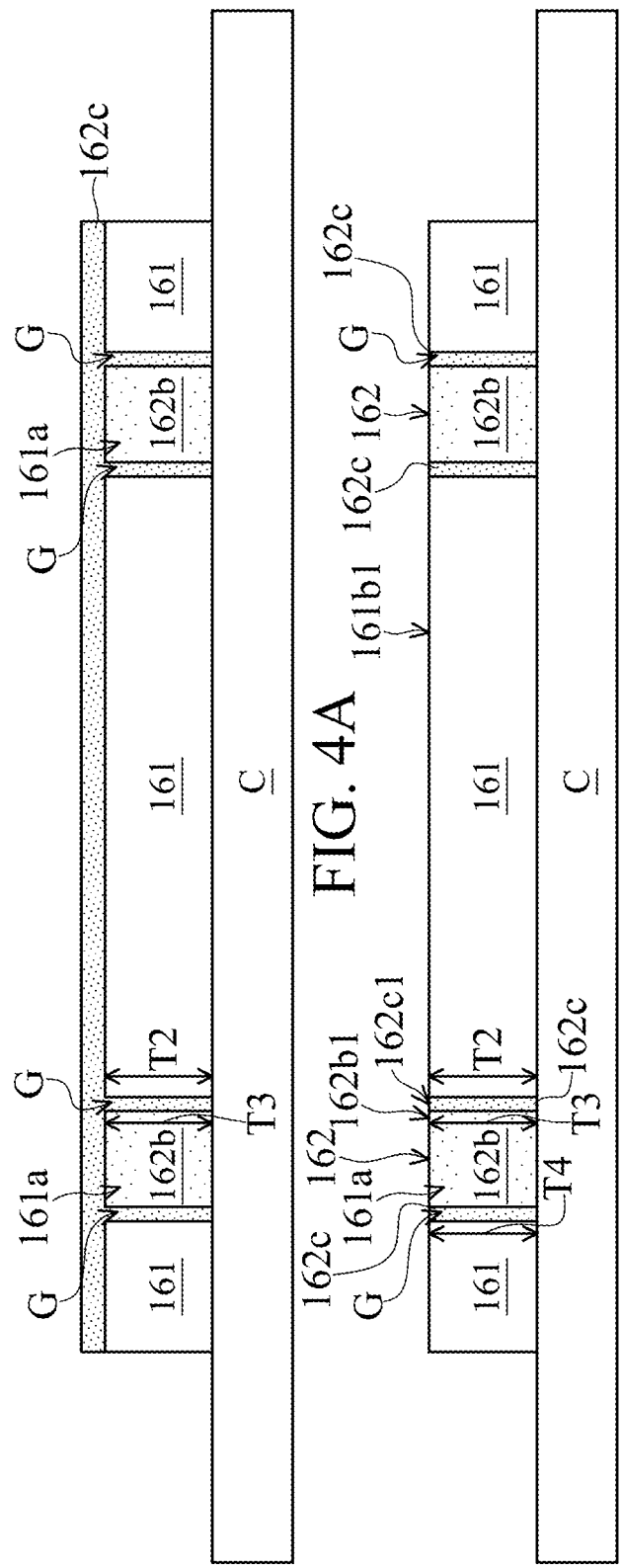
FIG. 4A
FIG. 4B
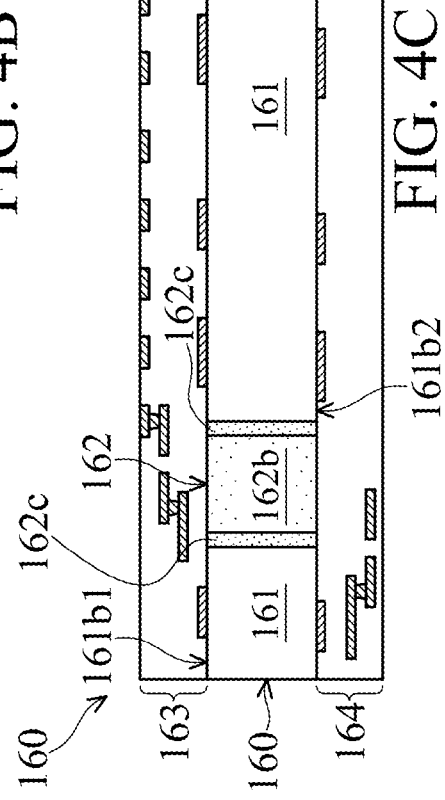
FIG. 4C

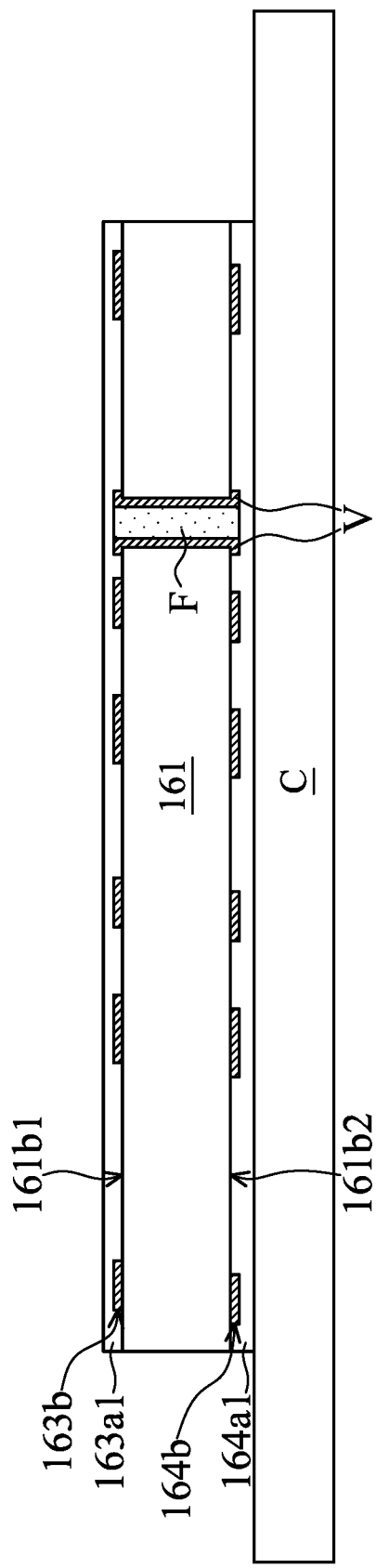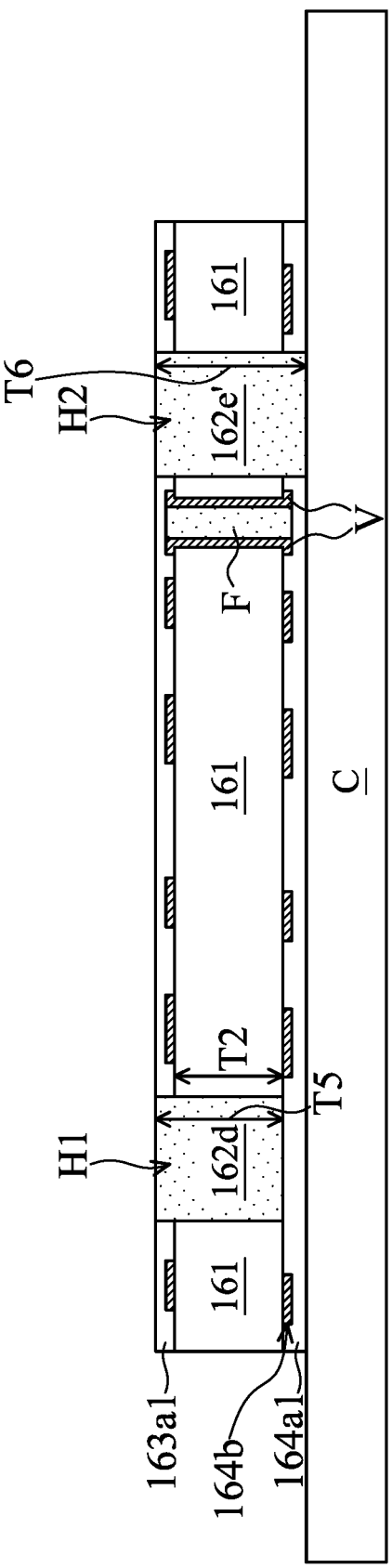

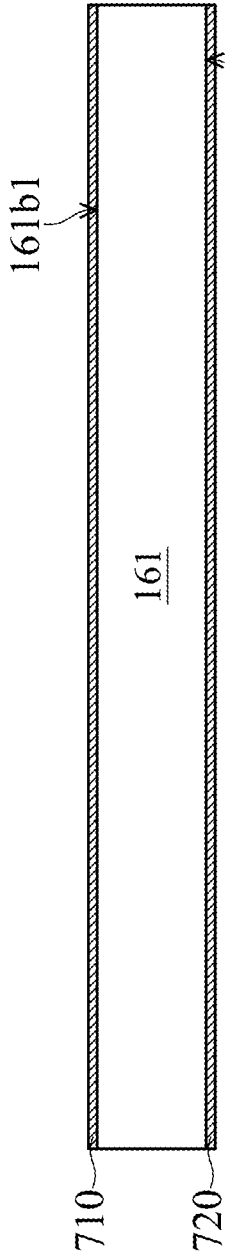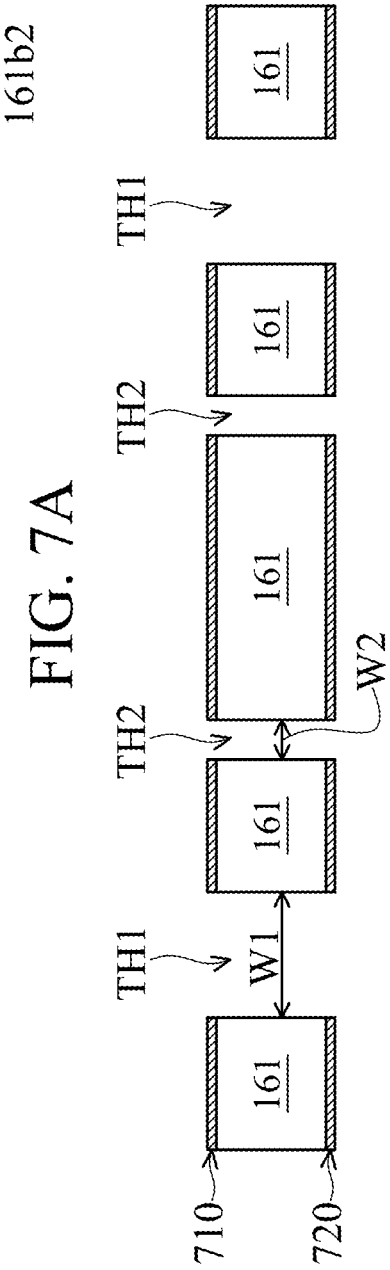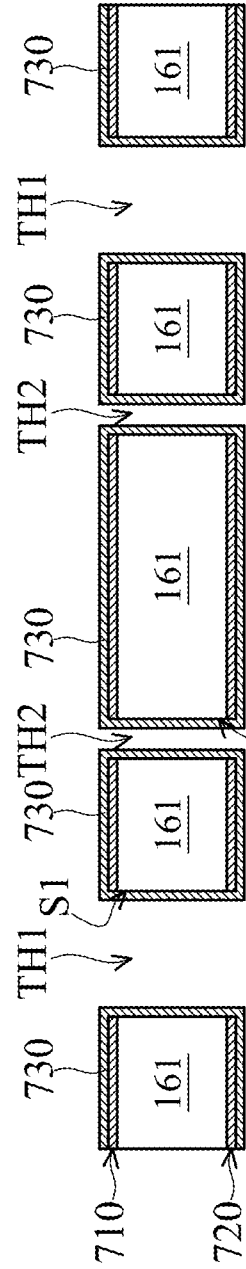

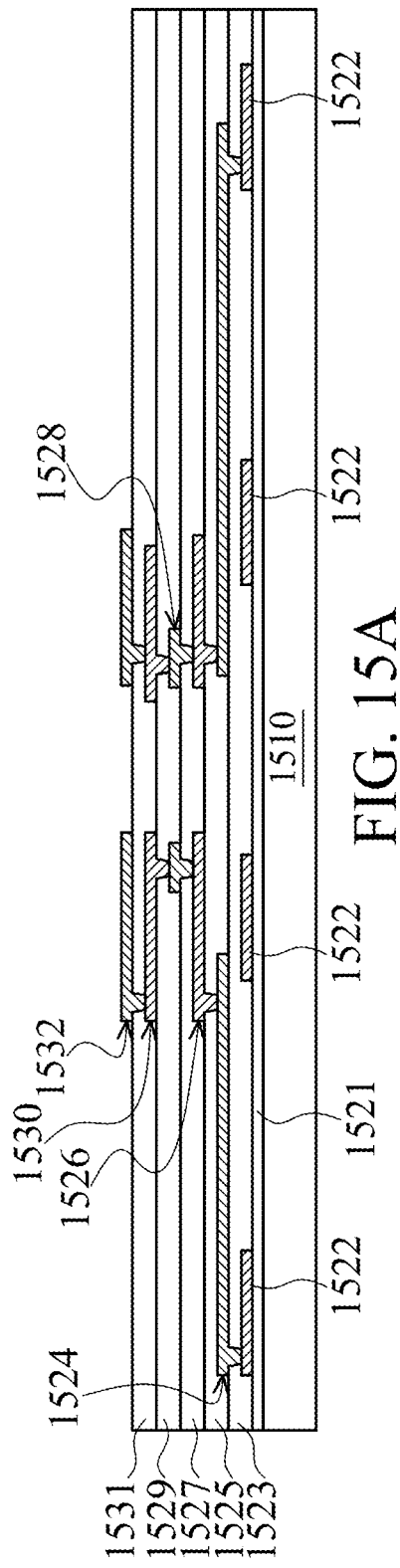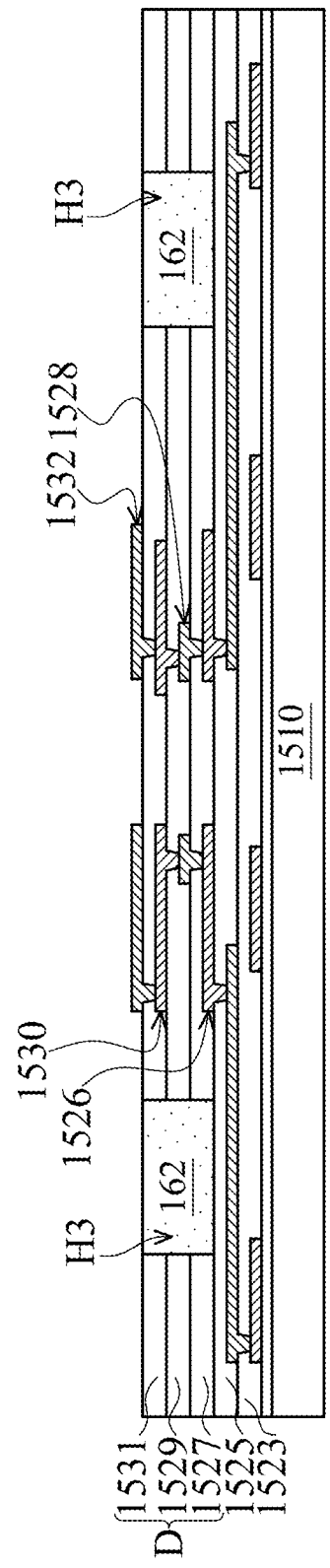
FIG. 15A
FIG. 15B

CHIP PACKAGE STRUCTURE WITH BUFFER STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating layers or dielectric layers, conductive layers, and semiconductor layers over a semiconductor substrate, and patterning the various material layers using photolithography processes and etching processes to form circuit components and elements thereon.

Many integrated circuits (IC) are typically manufactured on a semiconductor wafer. Technological advances in IC materials and design have produced generations of ICs. Each generation has smaller and more complex circuits than the previous generation. The dies of the wafer may be processed and packaged at the wafer level, and various technologies have been developed for wafer level packaging. Since the chip package structure may need to include multiple chips with multiple functions, it is a challenge to form a reliable chip package structure with multiple chips.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1H are cross-sectional views of various stages of a process for forming a chip package structure, in accordance with some embodiments.

FIG. 1A-1 is a top view of the chip package structure of FIG. 1A, in accordance with some embodiments.

FIGS. 1F-1 to 1H-1 are top views of the chip package structure of FIGS. 1F-1H, in accordance with some embodiments.

FIGS. 4A-4D are cross-sectional views of various stages of a process for forming a chip package structure, in accordance with some embodiments.

FIG. 4D-1 is a top view of the chip package structure of FIG. 4D, in accordance with some embodiments.

FIGS. 6A-6D are cross-sectional views of various stages of a process for forming a chip package structure, in accordance with some embodiments.

FIGS. 7A-7H are cross-sectional views of various stages of a process for forming a chip package structure, in accordance with some embodiments.

FIG. 7H-1 is a top view of the chip package structure of FIG. 7H, in accordance with some embodiments.

FIGS. 15A-15E are cross-sectional views of various stages of a process for forming a chip package structure, in accordance with some embodiments.

FIG. 15E-1 is a top view of the chip package structure of FIG. 15E, in accordance with some embodiments.

DETAILED DESCRIPTION

Figure 1A:
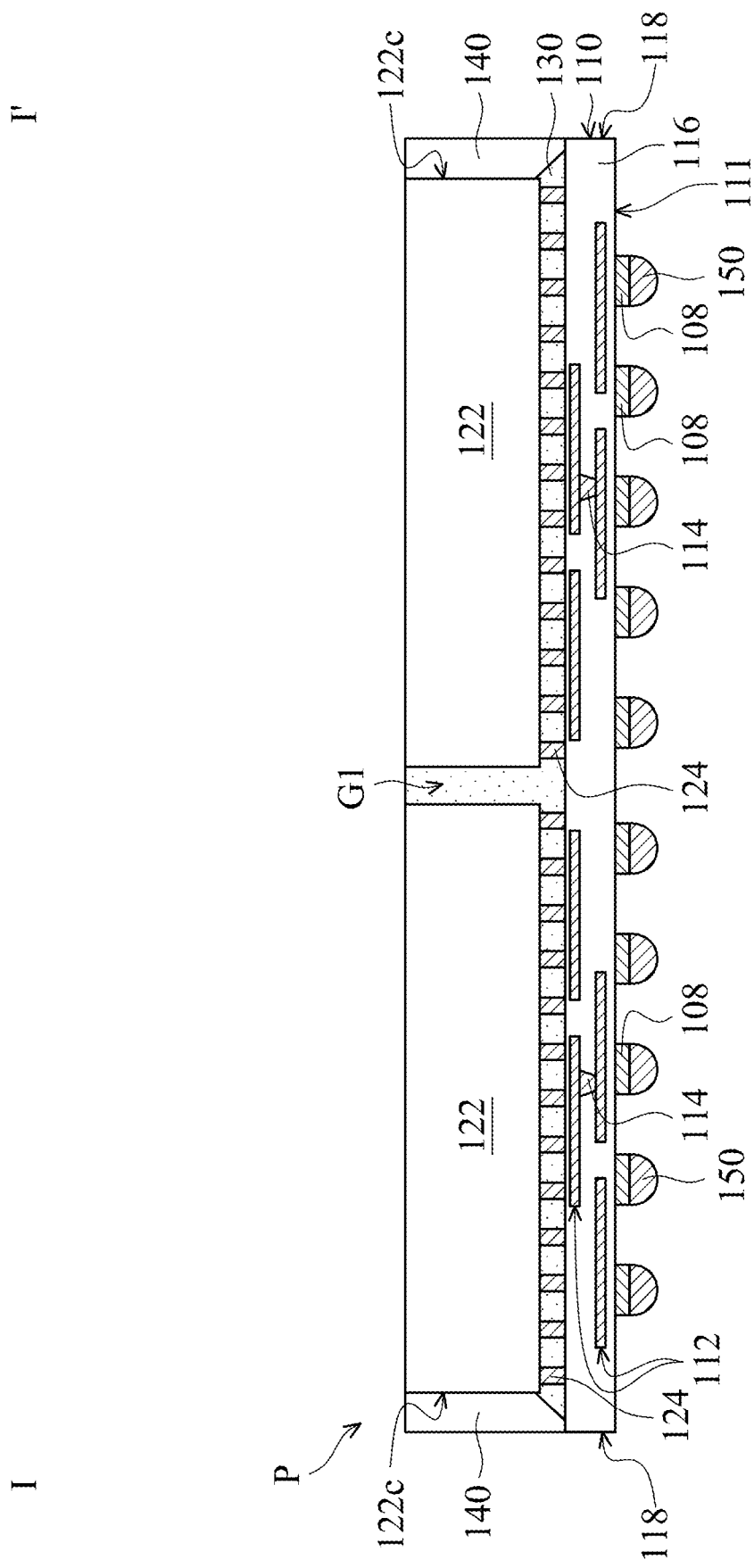

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figures 1, 1A:
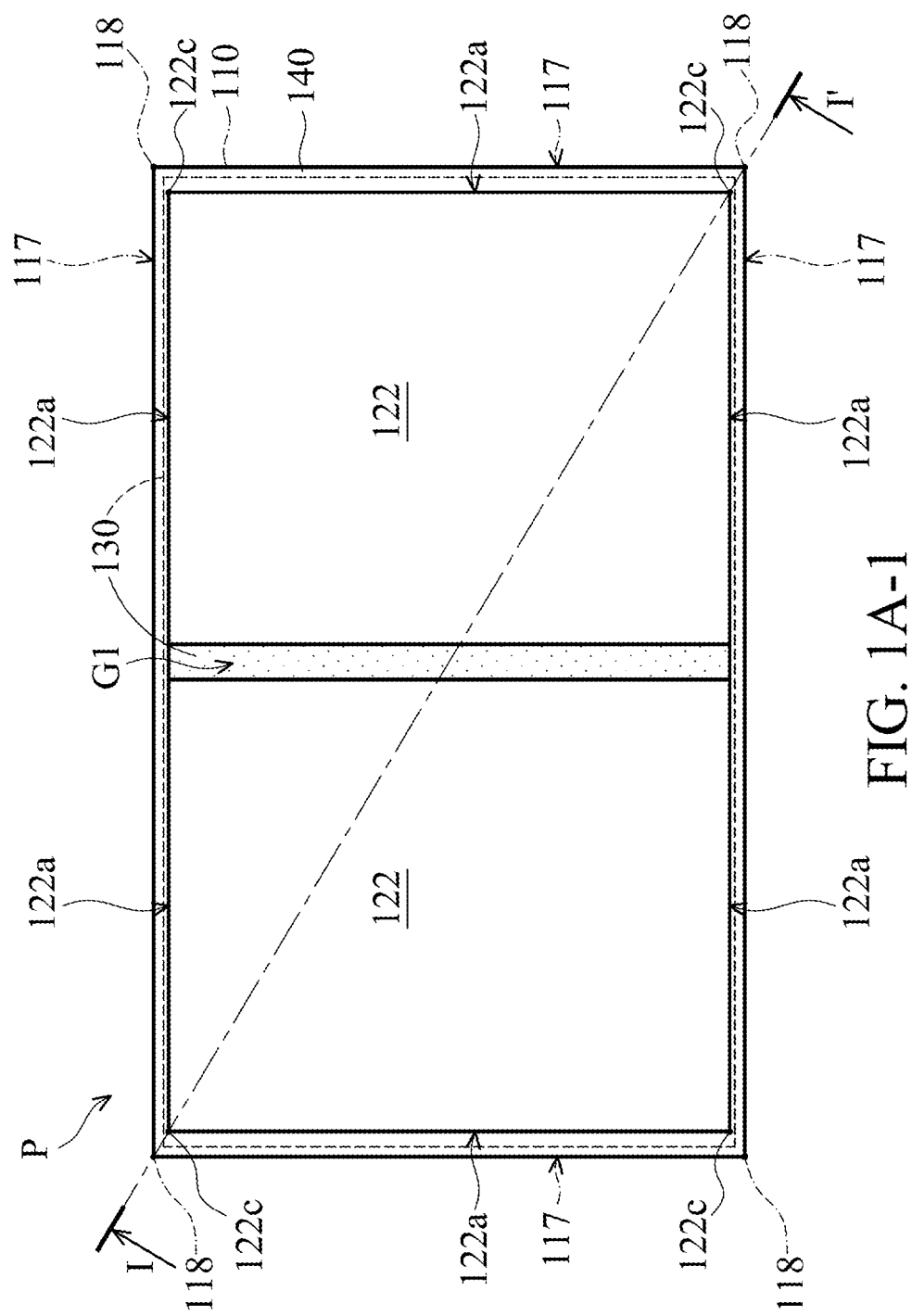

FIGS. 1A-1H are cross-sectional views of various stages of a process for forming a chip package structure, in accordance with some embodiments. FIG. 1A-1 is a top view of the chip package structure of FIG. 1A, in accordance with some embodiments. FIG. 1A is a cross-sectional view illustrating the chip package structure along a sectional line I-I' in FIG. 1A-1, in accordance with some embodiments.

As shown in FIGS. 1A and 1A-1, a chip package P is provided, in accordance with some embodiments. The chip package P includes an interposer substrate 110, chip structures 122, conductive pillars 124, an underfill layer 130, and a molding layer 140, in accordance with some embodiments. The interposer substrate 110 includes wiring layers 112, conductive vias 114, and a dielectric layer 116, in accordance with some embodiments.

The wiring layers 112 and the conductive vias 114 are formed in the dielectric layer 116, in accordance with some embodiments. As shown in FIG. 1A, the conductive vias 114 are electrically connected between different wiring layers 112, in accordance with some embodiments. For the sake of simplicity, FIG. 1A only shows two of the wiring layers 112, in accordance with some embodiments.

The dielectric layer 116 is made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments.

The dielectric layer 116 is formed using deposition processes (e.g. chemical vapor deposition processes or physical vapor deposition processes), photolithography processes, and/or etching processes, in accordance with some embodiments. The wiring layers 112 and the conductive vias 114 are made of a conductive material, such as metal (e.g. copper, aluminum, or tungsten) or alloys thereof, in accordance with some embodiments.

As shown in FIG. 1A-1, the interposer substrate 110 has sidewalls 117, in accordance with some embodiments. As shown in FIGS. 1A and 1A-1, the interposer substrate 110 has corners 118, in accordance with some embodiments. Each corner 118 is between two adjacent sidewalls 117, in accordance with some embodiments.

The chip structures 122 are bonded to the interposer substrate 110 through the conductive pillars 124, in accordance with some embodiments. The conductive pillars 124 are physically and electrically connected between the chip structures 122 and the interposer substrate 110, in accordance with some embodiments. The chip structures 122 are spaced apart from each other by a gap G1, in accordance with some embodiments.

As shown in FIG. 1A-1, the chip structure 122 has sidewalls 122a, in accordance with some embodiments. The chip structure 122 has corners 122c, in accordance with some embodiments. Each corner 122c is between two adjacent sidewalls 122a, in accordance with some embodiments.

Each chip structure 122 includes a chip, such as a system on chip (SoC), in accordance with some embodiments. The chip includes a substrate, in accordance with some embodiments. In some embodiments, the substrate is made of an elementary semiconductor material including silicon or germanium in a single crystal structure, a polycrystal structure, or an amorphous structure. In some other embodiments, the substrate is made of a compound semiconductor, such as silicon carbide, gallium arsenide, gallium phosphide, indium phosphide, indium arsenide, an alloy semiconductor, such as SiGe, or GaAsP, or a combination thereof. The substrate may also include multi-layer semiconductors, semiconductor on insulator (SOI) (such as silicon on insulator or germanium on insulator), or a combination thereof.

In some embodiments, the substrate includes various device elements. In some embodiments, the various device elements are formed in and/or over the substrate. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate. The isolation features are used to define active regions and electrically isolate various device elements formed in and/or over the substrate in the active regions. In some embodiments, the isolation features include shallow trench isolation (STI) features, local oxidation of silicon (LOCOS) features, other suitable isolation features, or a combination thereof.

In some other embodiments, the chip structure 122 includes a chip package structure. In some embodiments, the chip package structure includes one chip. In some other embodiments, the chip package structure includes multiple chips, which are arranged side by side or stacked with each other (e.g., a 3D packaging or a 3DIC device).

The conductive pillars 124 are made of a conductive material such as copper (Cu), aluminum (Al), tungsten (W), cobalt (Co), nickel (Ni), or tin (Sn), in accordance with some embodiments. The conductive pillars 124 are formed using a plating process such as an electroplating process, in accordance with some embodiments.

As shown in FIGS. 1A and 1A-1, the underfill layer 130 is between the chip structures 122 and the interposer substrate 110, in accordance with some embodiments. The underfill layer 130 surrounds the conductive pillars 124 and the chip structures 122, in accordance with some embodiments.

The underfill layer 130 extends into the gap G1, in accordance with some embodiments. The gap G1 is filled with the underfill layer 130, in accordance with some embodiments. The underfill layer 130 is made of an insulating material, such as a polymer material, in accordance with some embodiments.

As shown in FIGS. 1A and 1A-1, the molding layer 140 is formed over the interposer substrate 110 and the underfill layer 130, in accordance with some embodiments. The molding layer 140 surrounds the chip structures 122, the conductive pillars 124, and the underfill layer 130, in accordance with some embodiments. The molding layer 140 is made of an insulating material, such as a polymer material (e.g., epoxy), in accordance with some embodiments.

As shown in FIGS. 1A and 1A-1, the conductive pillars 108 are formed over a bottom surface 111 of the interposer substrate 110, in accordance with some embodiments. The conductive pillars 108 are made of a conductive material such as copper (Cu), aluminum (Al), tungsten (W), cobalt (Co), nickel (Ni), or tin (Sn), in accordance with some embodiments. The conductive pillars 108 are formed using a plating process such as an electroplating process, in accordance with some embodiments.

As shown in FIGS. 1A and 1A-1, solder bumps 150 are formed over the conductive pillars 108, in accordance with some embodiments. The solder bumps 150 are also referred to as controlled collapse chip connection bumps (C4 bumps), in accordance with some embodiments. The solder bumps 150 are made of tin (Sn), an alloy thereof, or another suitable conductive material with a melting point lower than that of the conductive pillars 108, in accordance with some embodiments. The solder bumps 150 are formed using a plating process such as an electroplating process, in accordance with some embodiments.

As shown in FIG. 1B, a carrier substrate C is provided, in accordance with some embodiments. The carrier substrate C is used to support a substrate in subsequent processes, in accordance with some embodiments. The carrier substrate C is made of metal, glass, semiconductor material (e.g., silicon), polymer, the like, or another suitable material, in accordance with some embodiments.

As shown in FIG. 1B, a substrate 161 is disposed over the carrier substrate C, in accordance with some embodiments. The substrate 161 is also referred to as a core substrate, in accordance with some embodiments. In some embodiments, the substrate 161 is made of organic materials such as epoxy, resin, glass fiber, molding compound, plastic (such as polyvinylchloride (PVC), acrylonitrile, butadiene and styrene (ABS), polypropylene (PP), polyethylene (PE), polystyrene (PS), polymethyl methacrylate (PMMA), polyethylene terephthalate (PET), polycarbonates (PC), polyphenylene sulfide (PPS)), the like, or a combination thereof. In some other embodiments, the substrate 161 is made of a conductive material (e.g., metal or alloy), a semiconductor material (e.g., silicon), glass, the like, a combination thereof, or another suitable material.

As shown in FIG. 1C, portions of the substrate 161 are removed to form recesses 161a in the substrate 161, in accordance with some embodiments. The recesses 161a pass through the substrate 161, in accordance with some embodiments. The recesses 161a are formed using a drilling process, such as a laser drilling process, an etching process, or another suitable process.

Figure 1D:
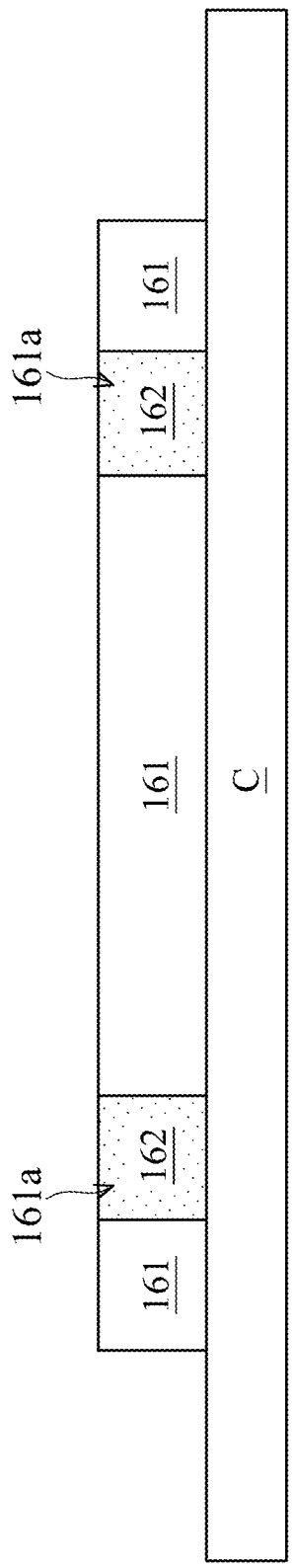

As shown in FIG. 1D, buffer structures 162 are formed in the recesses 161a, in accordance with some embodiments. The buffer structures 162 passes through the substrate 161, in accordance with some embodiments. In some embodiments, the Young's modulus of the buffer structures 162 is less than the Young's modulus of the substrate 161.

The ratio of the Young's modulus of the buffer structures 162 to the Young's modulus of the substrate 161 ranges from about 0.01 to about 0.2, in accordance with some embodiments. If the aforementioned ratio is greater than 0.2, the buffer structures 162 may be unable to effectively buffer the stress resulting from the coefficient of thermal expansion (CTE) mismatch between the substrate 161 and the chip structures 122 of FIG. 1A, which are formed over the substrate 161 and the buffer structures 162 in the subsequent process.

The Young's modulus of the buffer structures 162 ranges from about 0.2 GPa to about 6 GPa, in accordance with some embodiments. The Young's modulus of the substrate 161 ranges from about 10 GPa to about 30 GPa, in accordance with some embodiments. The Young's modulus of the buffer structures 162 and the Young's modulus of the substrate 161 are measured at a high temperature ranging from about 125° C. to about 260° C., in accordance with some embodiments.

The buffer structures 162 are softer than the substrate 161, in accordance with some embodiments. The hardness of the buffer structures 162 are less than the hardness of the substrate 161, in accordance with some embodiments. The rigidity of the buffer structures 162 are less than the rigidity of the substrate 161, in accordance with some embodiments.

The buffer structures 162 are made of a material having a Young's modulus less than that of the substrate 161, in accordance with some embodiments. For example, the buffer structures 162 are made of an organic material, such as epoxy glue, silicon glue, resin, rubber, poly ethylene (PE), polyimide, the like, or a combination thereof. The buffer structures 162 are formed using a dispensing process or another suitable process, in accordance with some embodiments.

Figure 1E:
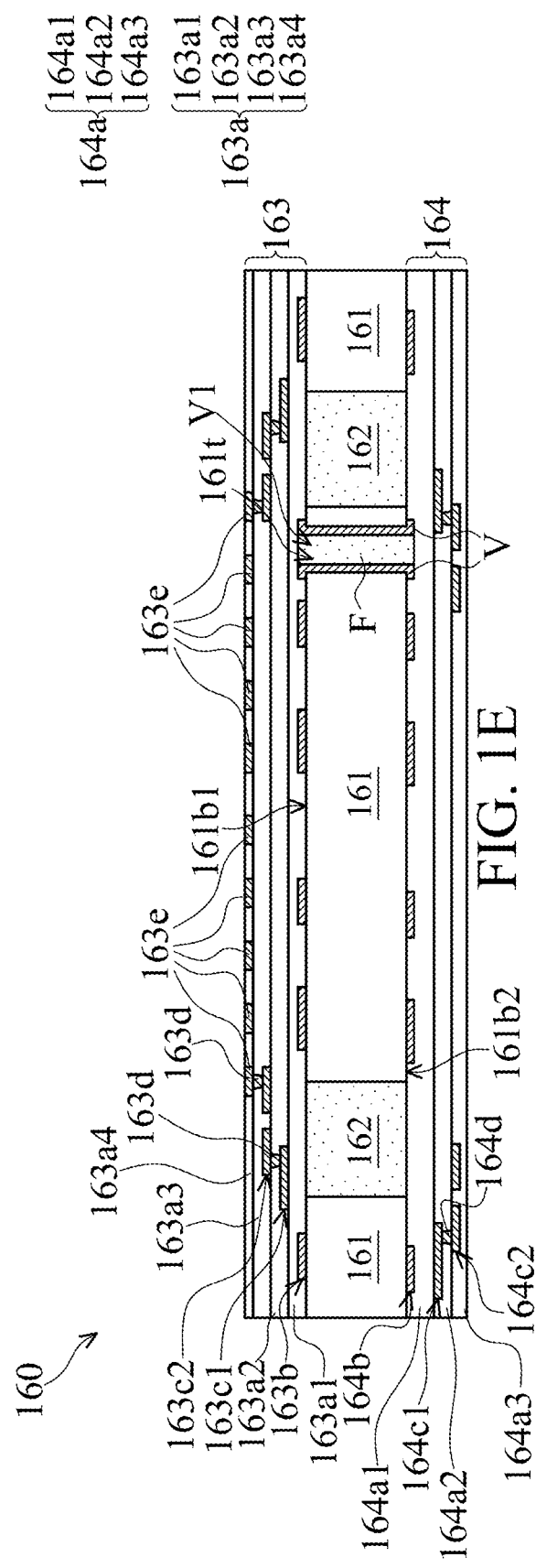

As shown in FIG. 1E, the carrier substrate C is removed, in accordance with some embodiments. As shown in FIG. 1E, conductive vias V are formed in the substrate 161, in accordance with some embodiments. For the sake of simplicity, FIG. 1E only shows one of the conductive vias V, in accordance with some embodiments.

Each conductive via V passes through the substrate 161 and extends onto opposite surfaces 161b1 and 161b2 of the substrate 161, in accordance with some embodiments. Each conductive via V has a through hole V1, in accordance with some embodiments. Each through hole V1 is filled with a filling plug F, in accordance with some embodiments.

The conductive vias V are made of a conductive material, such as metal (e.g. copper, aluminum, or tungsten) or alloys thereof, in accordance with some embodiments. The filling plug F is made of an insulating material, such as an organic material (e.g., epoxy, silicon glue, resin, rubber, poly ethylene, or polyimide), in accordance with some embodiments. In some embodiments, the filling plug F and the buffer structures 162 are made of the same material. In some other embodiments, the filling plug F and the buffer structures 162 are made of different materials.

The formation of the conductive vias V and the filling plugs F includes forming through holes 161t in the substrate 161; plating a conductive layer (not shown) over inner walls of the through holes 161*t* and the surfaces 161*b*1 and 161*b*2 of the substrate 161; patterning the conductive layer to form the conductive vias V; and forming the filling plugs F in the through holes V1 of the conductive vias V, in accordance with some embodiments.

As shown in FIG. 1E, wiring structures 163 and 164 are formed over opposite surfaces 161*b*1 and 161*b*2 of the substrate 161, in accordance with some embodiments. The wiring structures 163 and 164 cover the buffer structures 162, in accordance with some embodiments. In this step, a wiring substrate 160 is substantially formed, in accordance with some embodiments. The wiring substrate 160 includes the substrate 161, the buffer structures 162, and the wiring structures 163 and 164, in accordance with some embodiments.

The wiring structure 163 include a dielectric structure 163*a*, wiring layers 163*b*, 163*c*1 and 163*c*2, conductive vias 163*d*, and conductive pads 163*e*, in accordance with some embodiments. The dielectric structure 163*a* includes dielectric layers 163*a*1, 163*a*2, 163*a*3, and 163*a*4, in accordance with some embodiments.

The wiring layer 163*b*, the dielectric layer 163*a*1, the wiring layer 163*c*1, the dielectric layer 163*a*2, the wiring layer 163*c*2, the dielectric layer 163*a*3, the conductive pads 163*e*, and the dielectric layer 163*a*4 are sequentially stacked over the surface 161*b*1 of the substrate 161, in accordance with some embodiments.

The conductive vias 163*d* are formed in the dielectric structure 163*a* to be electrically connected between the wiring layers 163*b*, 163*c*1 and 163*c*2 and the conductive pads 163*e*, in accordance with some embodiments. The dielectric layer 163*a*4 is also referred to as a solder resist layer, in accordance with some embodiments.

Since the buffer structures 162 are softer than the substrate 161, the buffer structures 162 may tend to deform, in accordance with some embodiments. Therefore, the wiring layers 163*b* and 164*b* are not formed over the buffer structures 162, in accordance with some embodiments.

The dielectric structure 163*a* is made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. In some embodiments, the dielectric structure 163*a* and the substrate 161 are made of different materials. In some other embodiments, the dielectric structure 163*a* and the substrate 161 are made of the same material.

The wiring layers 163*b*, 163*c*1 and 163*c*2 are made of a conductive material, such as metal (e.g. copper, aluminum, or tungsten) or alloys thereof, in accordance with some embodiments. The conductive vias 163*d* are made of a conductive material, such as metal (e.g. copper, aluminum, or tungsten) or alloys thereof, in accordance with some embodiments. The conductive pads 163*e* are made of a conductive material, such as metal (e.g. copper, aluminum, or tungsten) or alloys thereof, in accordance with some embodiments.

In some embodiments, the wiring layers 163*b*, 163*c*1 and 163*c*2, the conductive vias 163*d*, and the conductive pads 163*e* are made of the same material. In some other embodiments. the wiring layers 163*b*, 163*c*1 and 163*c*2, the conductive vias 163*d*, and the conductive pads 163*e* are made of different materials.

The wiring structure 164 include a dielectric structure 164*a*, wiring layers 164*b*, 164*c*1 and 164*c*2, conductive vias 164*d*, and conductive pads (not shown), in accordance with some embodiments. The dielectric structure 164*a* includes dielectric layers 164*a*1, 164*a*2, and 164*a*3, in accordance with some embodiments. The wiring layer 164*b*, the dielectric layer 164*a*1, the wiring layer 164*c*1, the dielectric layer 164*a*2, the wiring layer 164*c*2, and the dielectric layer 164*a*3 are sequentially stacked over the surface 161*b*2 of the substrate 161, in accordance with some embodiments.

The conductive vias 164*d* are formed in the dielectric structure 164*a* to be electrically connected between the wiring layers 164*b*, 164*c*1 and 164*c*2, in accordance with some embodiments. The wiring layers 163*b*, 163*c*1 and 163*c*2 are electrically connected to the wiring layers 164*b*, 164*c*1 and 164*c*2 through conductive vias V, in accordance with some embodiments.

The dielectric structure 164*a* is made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. In some embodiments, the dielectric structure 164*a* and the substrate 161 are made of different materials. In some other embodiments, the dielectric structure 164*a* and the substrate 161 are made of the same material.

The wiring layers 164*b*, 164*c*1 and 164*c*2 are made of a conductive material, such as metal (e.g. copper, aluminum, or tungsten) or alloys thereof, in accordance with some embodiments. The conductive vias 164*d* are made of a conductive material, such as metal (e.g. copper, aluminum, or tungsten) or alloys thereof, in accordance with some embodiments.

In some embodiments, the wiring layers 164*b*, 164*c*1 and 164*c*2 and the conductive vias 164*d* are made of the same material. In some other embodiments. the wiring layers 164*b*, 164*c*1 and 164*c*2 and the conductive vias 164*d* are made of different materials.

Figure 1F:
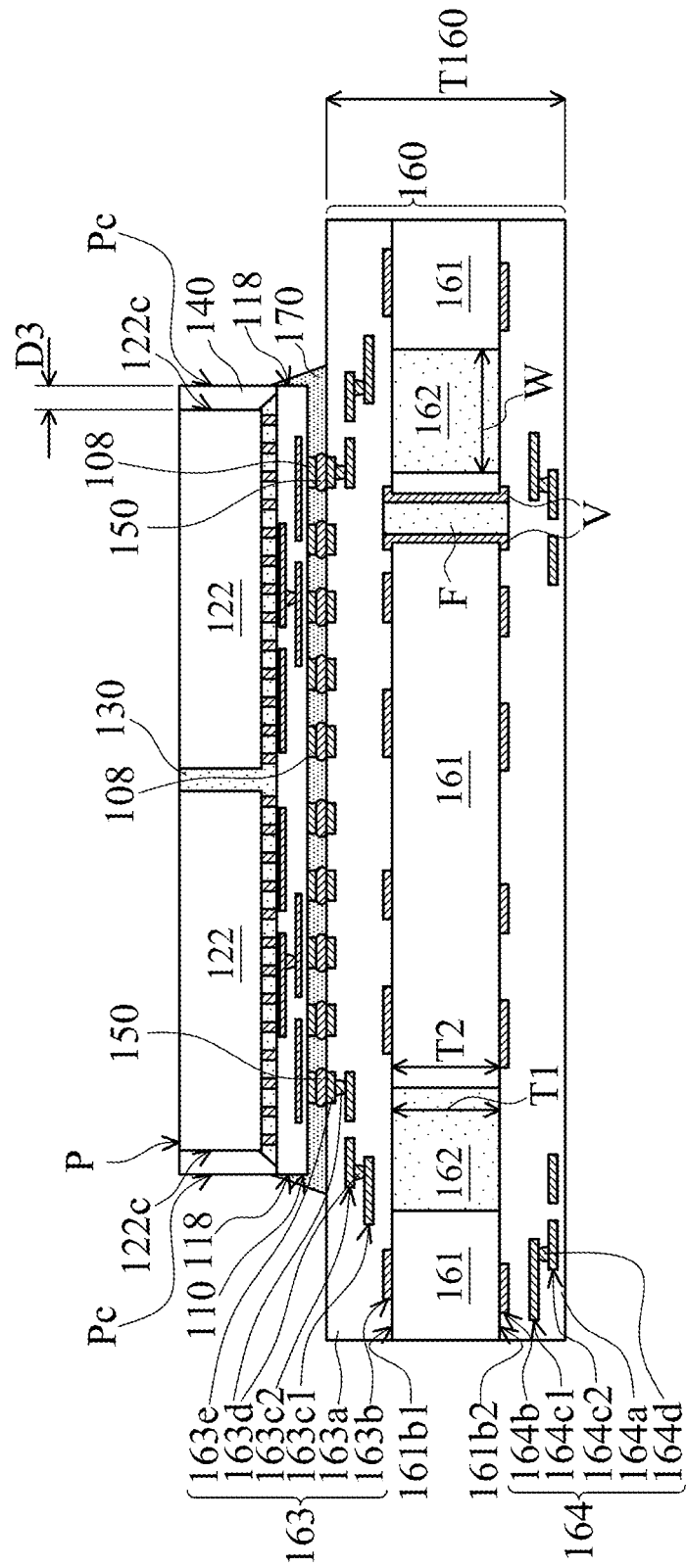
Figures 1, 1F:
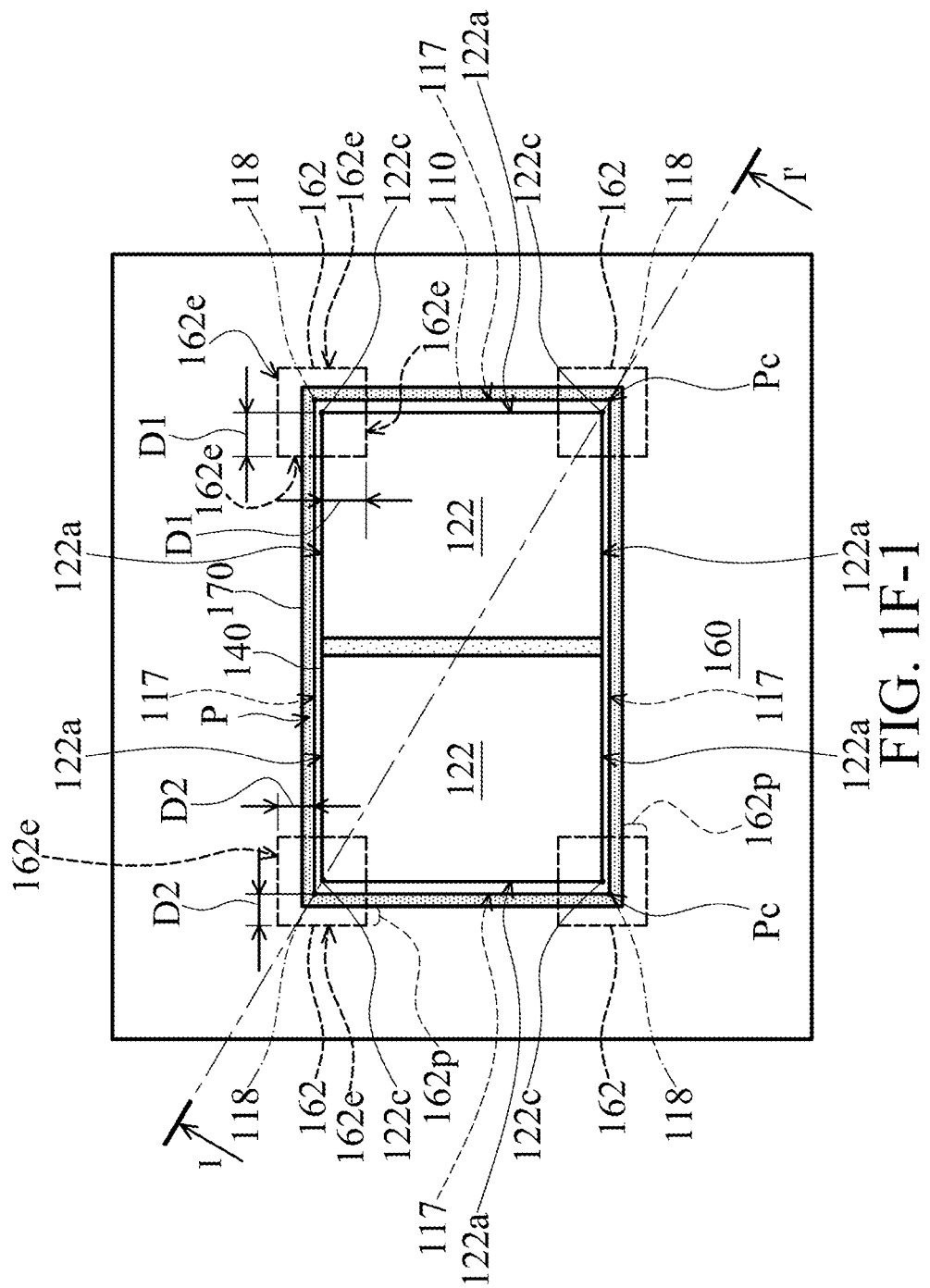
Figure 1G:
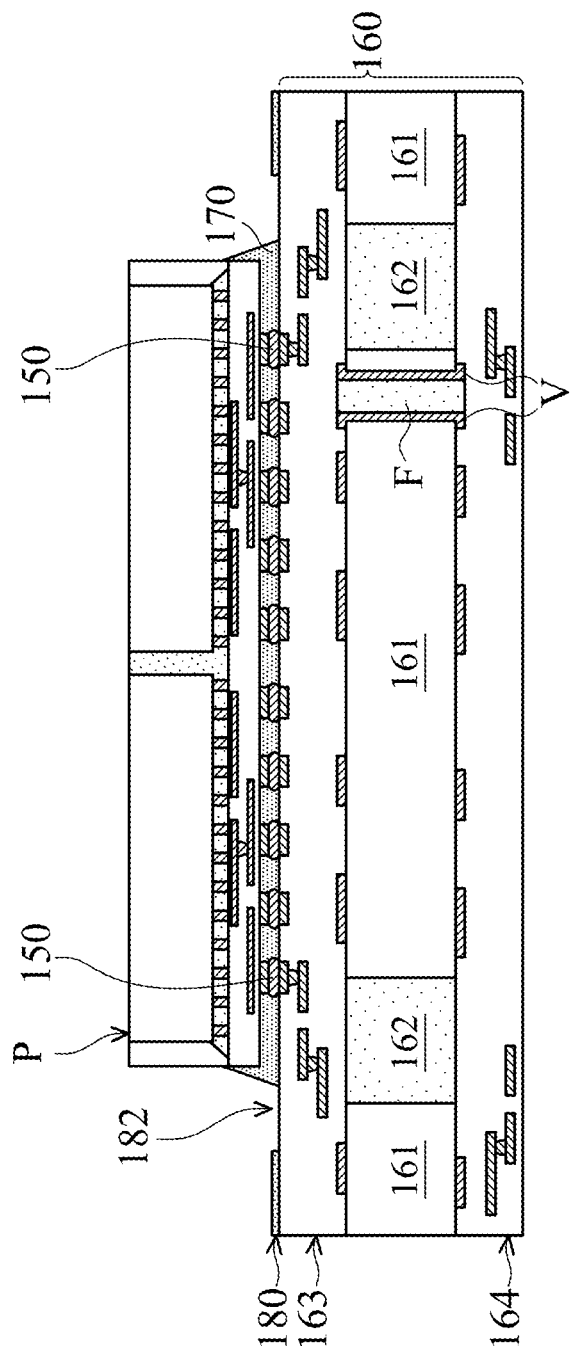
Figures 1, 1G:
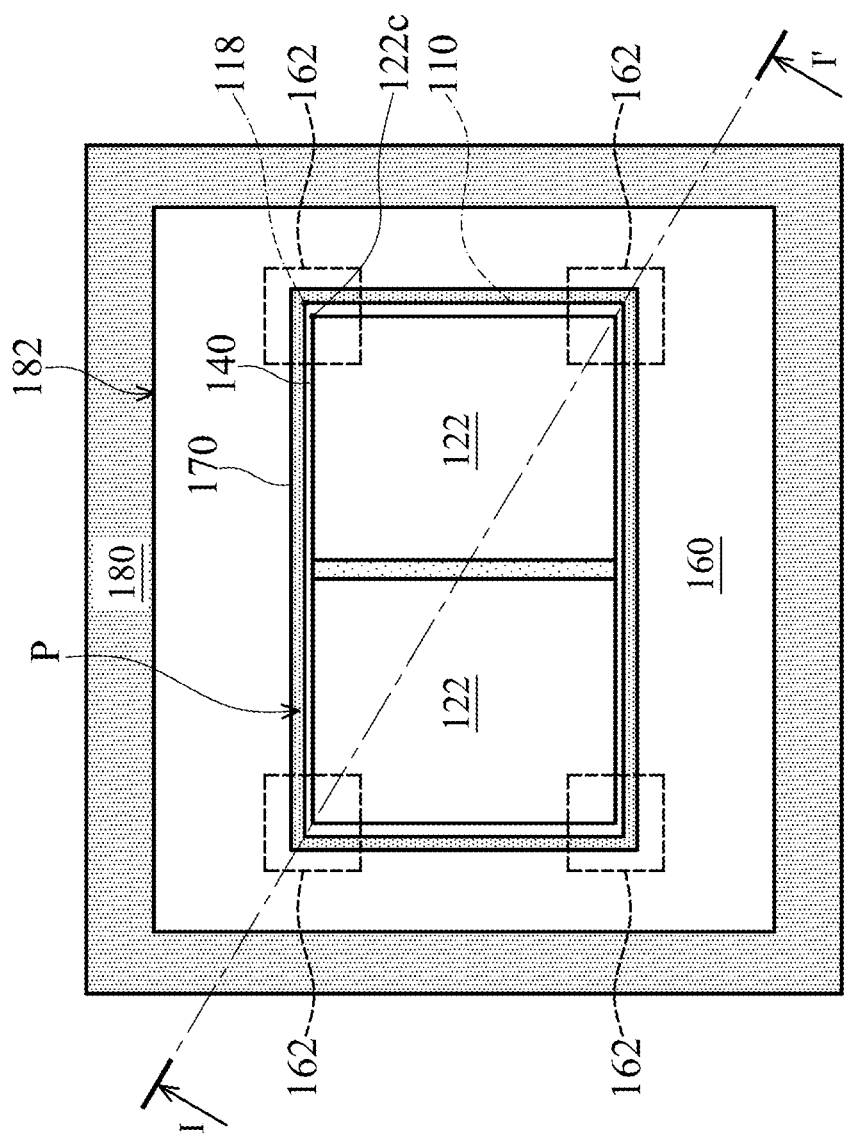
Figure 1H:
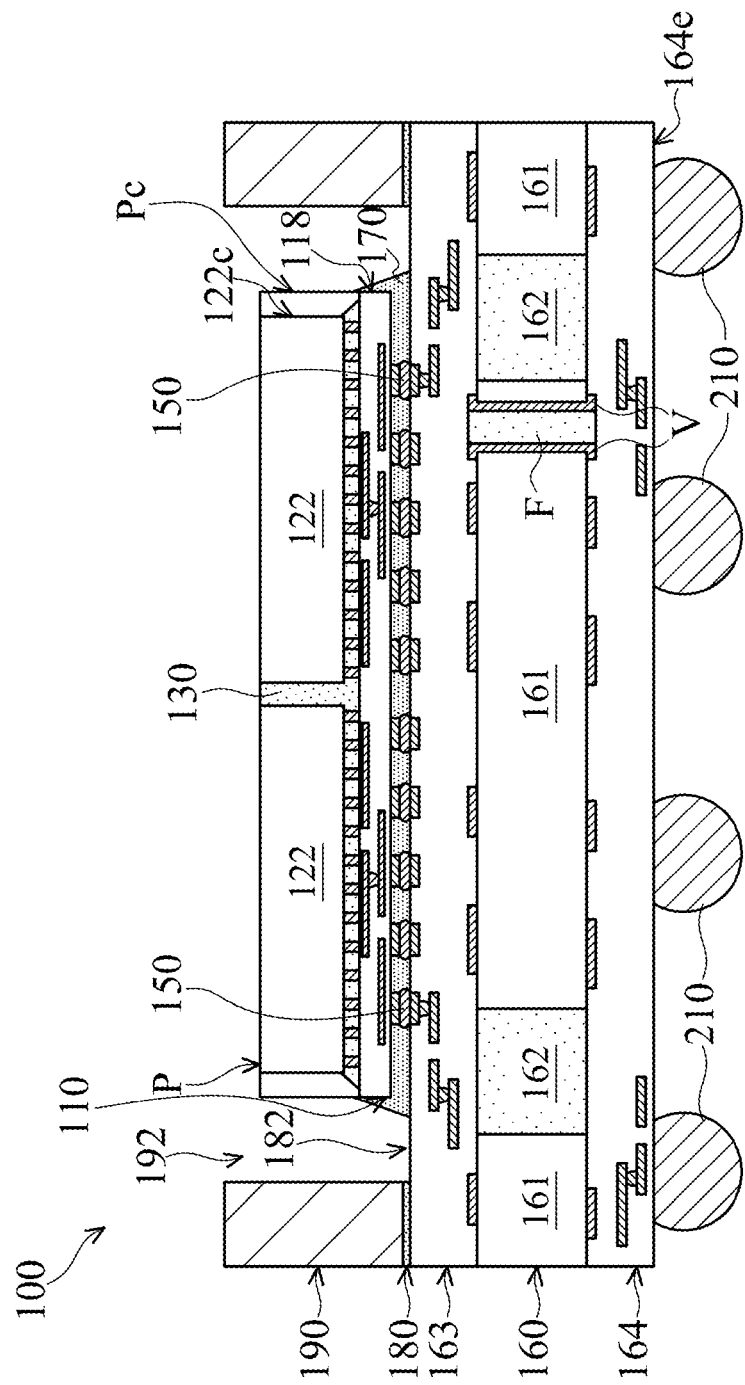
Figures 1, 1H:
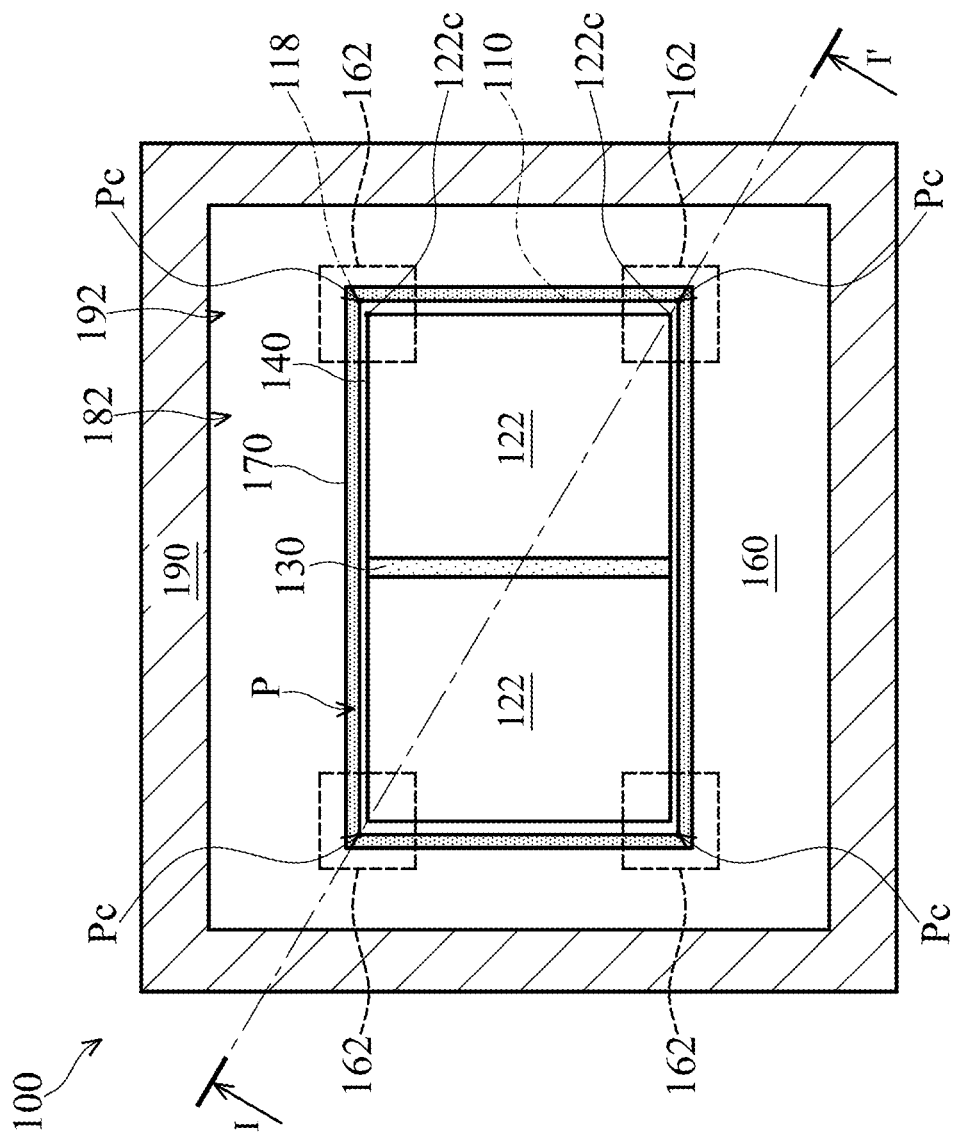

FIGS. 1F-1 to 1H-1 are top views of the chip package structure of FIGS. 1F-1H, in accordance with some embodiments. FIGS. 1F-1H are cross-sectional views illustrating the chip package structure along a sectional line I-I' in FIGS. 1F-1 to 1H-1, in accordance with some embodiments.

As shown in FIGS. 1F and 1F-1, the chip package P is bonded to a wiring substrate 160 through the solder bumps 150, in accordance with some embodiments. The solder bumps 150 are connected between the chip package P and the conductive pads 163*e*, in accordance with some embodiments. The chip structures 122 are electrically connected to the wiring substrate 160 through the solder bumps 150, in accordance with some embodiments.

As shown in FIGS. 1F and 1F-1, the chip package P has corner portions Pc, in accordance with some embodiments. The corner portions Pc overlap the buffer structures 162 thereunder, in accordance with some embodiments. As shown in FIGS. 1F and 1F-1, one of the corners 118 of the interposer substrate 110 and adjacent one of the corners 122*c* of the chip structure 122 both overlap the buffer structure 162 thereunder, in accordance with some embodiments. The buffer structure 162 continuously extends across the corners 118 and 122*c*, in accordance with some embodiments.

As shown in FIG. 1F-1, the buffer structure 162 extends across the sidewalls 122*a* (of the chip structure 122) adjacent to the corner 122*c* over the buffer structure 162 and the sidewalls 117 (of the interposer substrate 110) adjacent to the corner 118 over the buffer structure 162, in accordance with some embodiments.

As shown in FIGS. 1F and 1F-1, an underfill layer 170 is formed between the chip package P and the wiring substrate 160, in accordance with some embodiments. The underfill layer 170 surrounds the conductive pillars 108, the solder bumps 150 and the chip package P, in accordance with some embodiments. The underfill layer 170 is made of an insulating material, such as a polymer material, in accordance with some embodiments.

The coefficient of thermal expansion of the substrate 161 ranges from about 10 ppm/° C. to about 20 ppm/° C., in accordance with some embodiments. The coefficient of thermal expansion of the chip structure 122 ranges from about 1 ppm/° C. to about 5 ppm/° C., in accordance with some embodiments. The difference between the coefficients of thermal expansion of the substrate 161 and the chip structure 122 is large, in accordance with some embodiments.

The coefficient of thermal expansion mismatch between the chip structure 122 and the substrate 161 tends to result in a stress in the underfill layers 130 and 170 and the solder bumps 150, in accordance with some embodiments. In particular, the greatest stress is at the corners 122c and 118, which have the maximum distance to the neutral point (DNP), in accordance with some embodiments. The stress is positively correlated with the distance to the neutral point, in accordance with some embodiments. The neutral point may be a center of the composite structure composed of the chip structures 122 or a center of the interposer substrate 110, in accordance with some embodiments. The buffer structures 162 under the corners 122c and 118 may effectively buffer the aforementioned stress to protect the elements (e.g., the underfill layers 130 and 170 and the solder bumps 150) close to the corners 122c and 118 from being damaged by the stress.

As shown in FIG. 1F-1, the buffer structures 162 have a rectangular shape, such as a square shape, in accordance with some embodiments. The corner 122c is over a center of the buffer structure 162 thereunder, in accordance with some embodiments. Each buffer structure 162 has four edges 162e, in accordance with some embodiments. The distance D1 between the corner 122c and the edge 162e of the buffer structure 162 thereunder ranges from about 0.05 mm to about 40 mm, in accordance with some embodiments.

The distance D1 ranges from about 0.5 mm to about 40 mm, in accordance with some embodiments. If the distance D1 is less than 0.05 mm, the buffer structures 162 may be unable to effectively buffer the stress resulting from the coefficient of thermal expansion mismatch between the chip structure 122 and the substrate 161, in accordance with some embodiments.

As shown in FIG. 1F-1, the distance D2 between the corner 118 of the interposer substrate 110 and the edge 162e of the buffer structure 162 under the corner 118 ranges from about 0.01 mm to about 10 mm, in accordance with some embodiments. The distance D2 ranges from about 0.5 mm to about 10 mm, in accordance with some embodiments. If the distance D2 is less than 0.01 mm, the buffer structures 162 may be unable to effectively buffer the stress resulting from the coefficient of thermal expansion mismatch between the chip structure 122 and the substrate 161, in accordance with some embodiments.

As shown in FIG. 1F-1, the buffer structure 162 has a peripheral portion 162p, in accordance with some embodiments. The peripheral portion 162p does not overlap the interposer substrate 110 and the chip structures 122, in accordance with some embodiments. The peripheral portion 162p surrounds the corresponding corners 118 and 122c, in accordance with some embodiments.

As shown in FIG. 1F, a width W of the buffer structure 162 is greater than a distance D3 between the corner 118 (of the interposer substrate 110) and the corner 122c (of the chip structure 122), in accordance with some embodiments. The thickness T1 of the buffer structure 162 is substantially equal to the thickness T2 of the substrate 161, in accordance with some embodiments. The thickness T1 of the buffer structure 162 is less than the thickness T160 of the wiring substrate 160, in accordance with some embodiments.

As shown in FIGS. 1G and 1G-1, an adhesive layer 180 is formed over the wiring substrate 160, in accordance with some embodiments. The adhesive layer 180 has an opening 182, in accordance with some embodiments. The chip package P is in the opening 182, in accordance with some embodiments. The adhesive layer 180 is made of a polymer material such as epoxy or silicone, in accordance with some embodiments.

As shown in FIG. 1H, a ring structure 190 is disposed over the adhesive layer 180, in accordance with some embodiments. In this step, a chip package structure 100 is substantially formed, in accordance with some embodiments. As shown in FIGS. 1H and 1H-1, the ring structure 190 has an opening 192, in accordance with some embodiments. The opening 192 have a substantially rectangular shape, in accordance with some embodiments. The opening 192 is formed using a milling process, in accordance with some embodiments.

As shown in FIGS. 1H and 1H-1, the opening 182 of the adhesive layer 180 is under the opening 192, in accordance with some embodiments. As shown in FIGS. 1H and 1H-1, the chip package P is in the opening 192, in accordance with some embodiments. The ring structure 190 is made of a rigid material, such as metal (e.g., copper or iron), alloys thereof (e.g., stainless steel), or another suitable material which is more rigid than the wiring substrate 160, in accordance with some embodiments.

As shown in FIG. 1H, bumps 210 are formed over a bottom surface 164e of the wiring structure 164 to be electrically connected to the wiring structure 164, in accordance with some embodiments. In some embodiments, the bumps 210 are solder balls. The bumps 210 are made of a conductive material, such as tin, an alloy thereof, or the like, in accordance with some embodiments.

Figure 2:
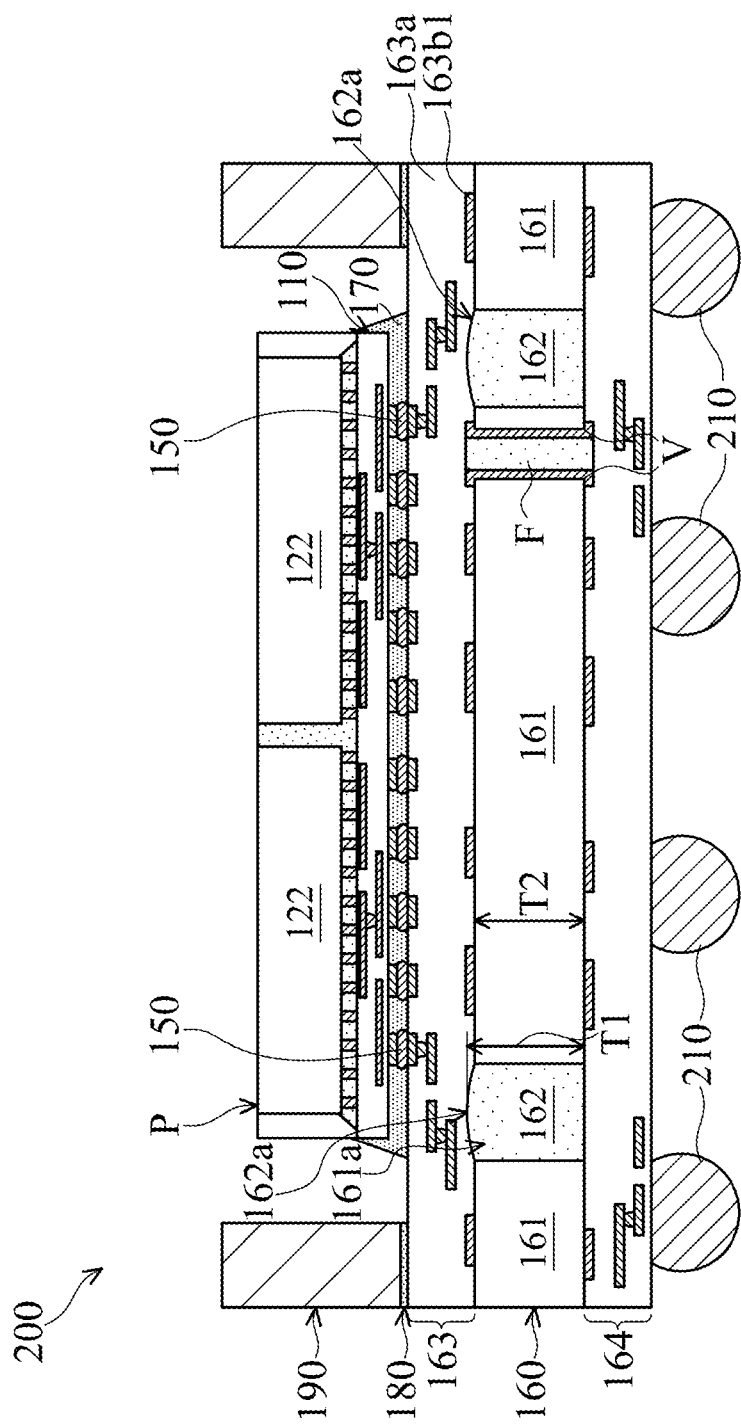
FIG. 2 is a cross-sectional view of a chip package structure, in accordance with some embodiments.

FIG. 2 is a cross-sectional view of a chip package structure 200, in accordance with some embodiments. As shown in FIG. 2, the chip package structure 200 is similar to the chip package structure 100 of FIG. 1H, except that the buffer structures 162 of the chip package structure 200 protrude from the substrate 161, in accordance with some embodiments. The buffer structures 162 have curved top surfaces 162a, in accordance with some embodiments. The buffer structures 162 extend into the dielectric structure 163a of the wiring structure 163, in accordance with some embodiments.

Figure 3:
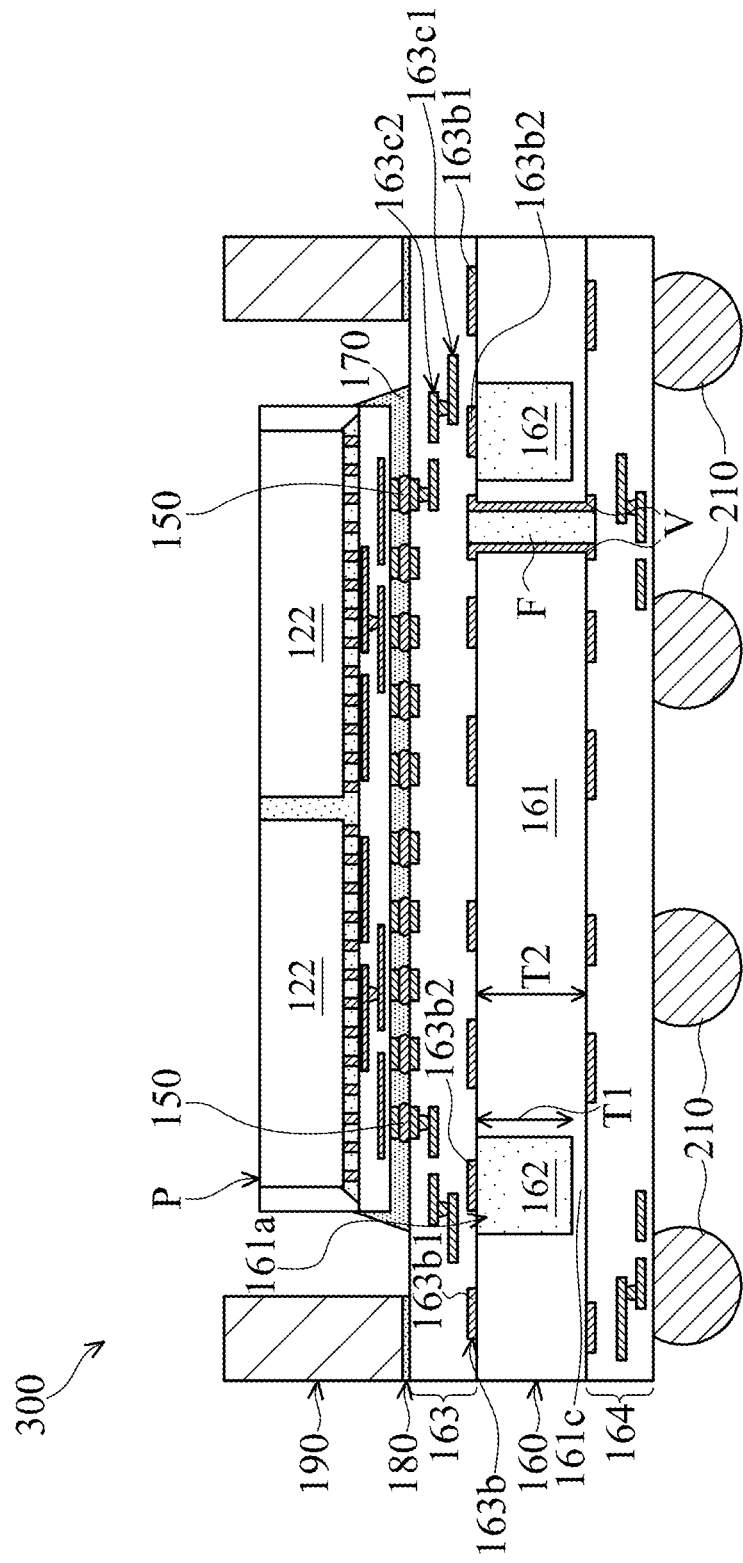
FIG. 3 is a cross-sectional view of a chip package structure, in accordance with some embodiments.

FIG. 3 is a cross-sectional view of a chip package structure 300, in accordance with some embodiments. As shown in FIG. 3, the chip package structure 300 is similar to the chip package structure 100 of FIG. 1H, except that the buffer structures 162 of the chip package structure 300 do not pass through the substrate 161, in accordance with some embodiments. The buffer structures 162 are between the wiring structure 163 and a lower portion 161c of the substrate 161, in accordance with some embodiments.

The thickness T1 of the buffer structure 162 is less than the thickness T2 of the substrate 161, in accordance with some embodiments. The ratio of the thickness T1 to the thickness T2 ranges from about 0.5 to about 0.99, in accordance with some embodiments. If the ratio of the thickness T1 to the thickness T2 is less than 0.5, the buffer structure 162 may be too thin to effectively buffer the stress resulting from the coefficient of thermal expansion mismatch between the chip structure 122 and the substrate 161, in accordance with some embodiments.

The wiring layer 163b has conductive lines 163b1 and dummy conductive lines 163b2, in accordance with some embodiments. The conductive lines 163b1 are formed over the substrate 161, in accordance with some embodiments. The conductive lines 163b1 are electrically connected to the wiring layers 163c1 and 163c2 and the chip package P, in accordance with some embodiments.

The dummy conductive lines 163b2 are formed over the buffer structures 162, in accordance with some embodiments. The dummy conductive lines 163b2 are electrically insulated from the conductive lines 163b1, the wiring layers 163c1 and 163c2, and the chip package P, in accordance with some embodiments. Therefore, even if the dummy conductive lines 163b2 are affected by the deformation of the buffer structures 162, the electrical property of the wiring layer 163b is not affected, in accordance with some embodiments.

Figure 4D:
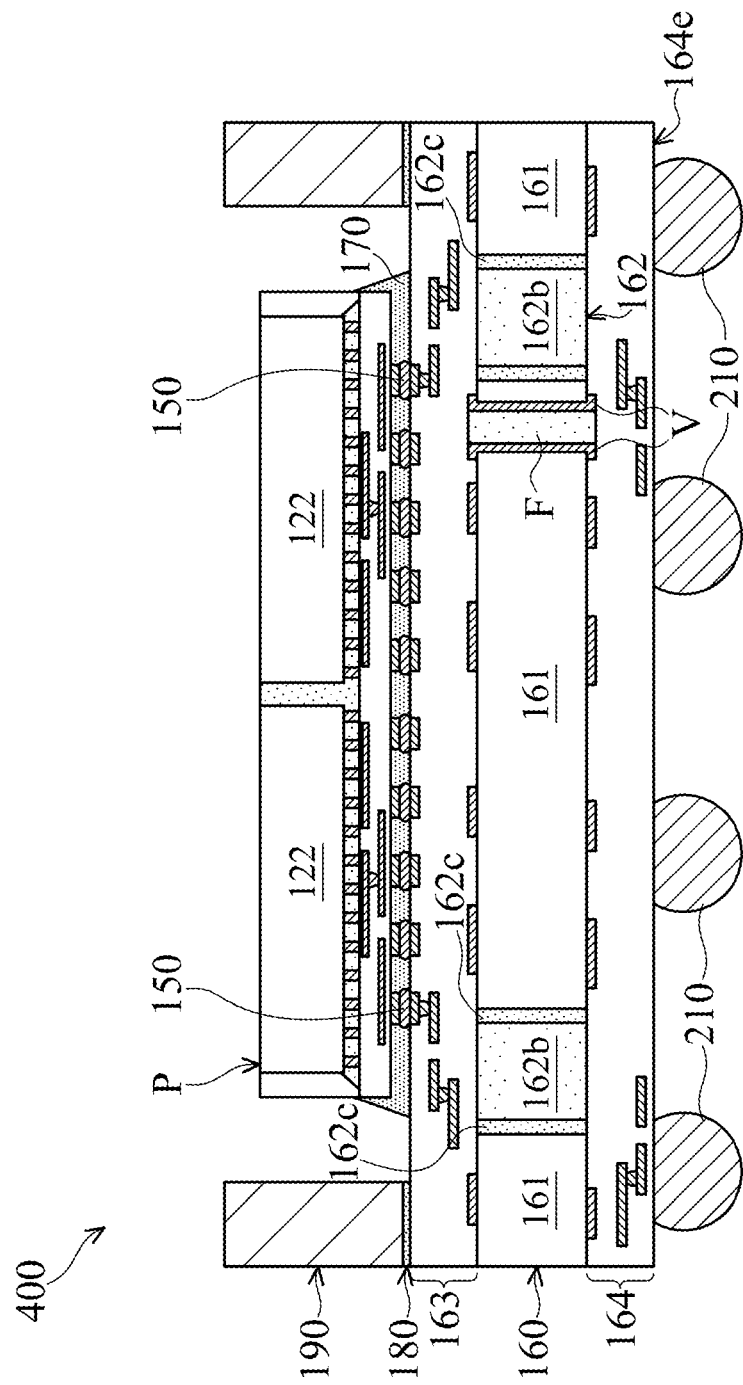
Figures 1, 4D:
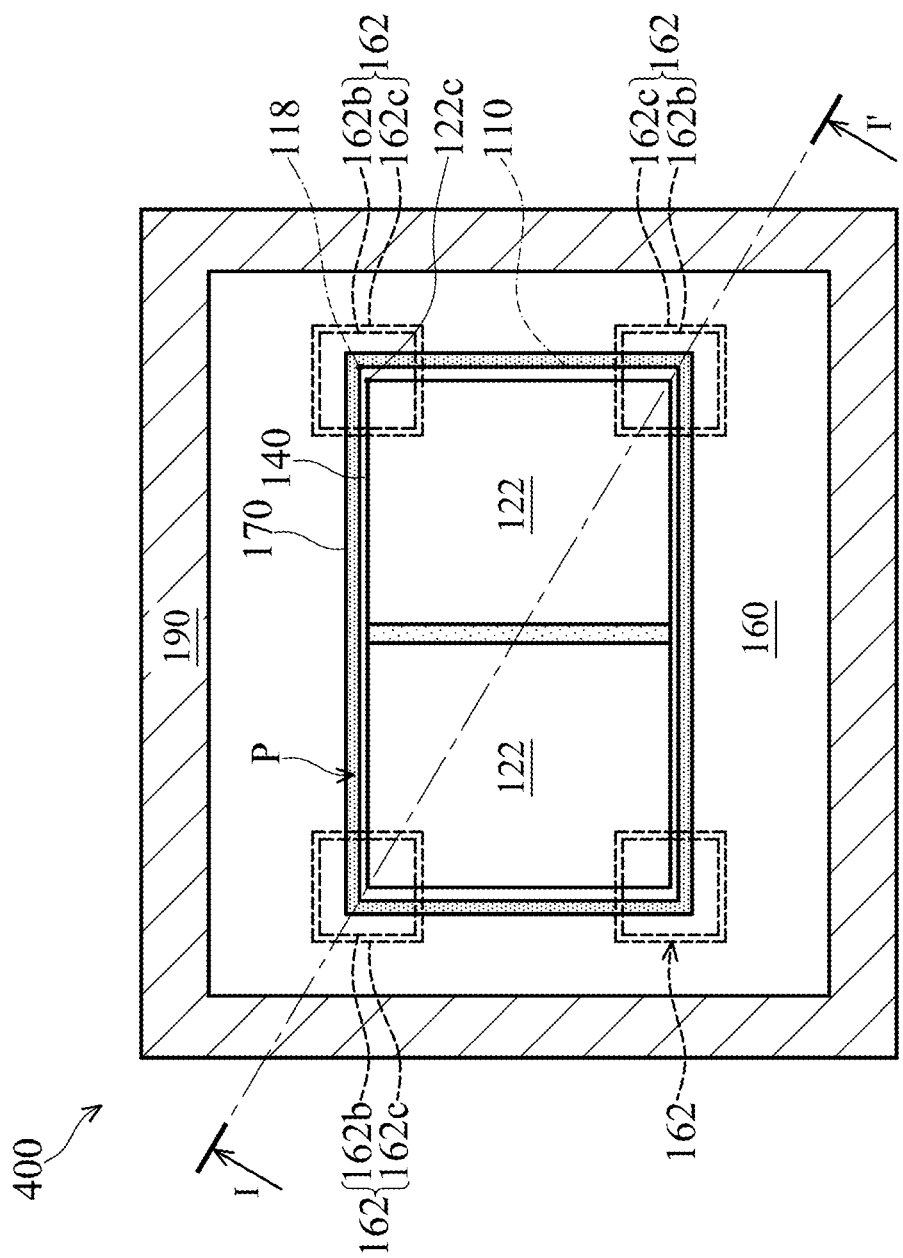

FIGS. 4A-4D are cross-sectional views of various stages of a process for forming a chip package structure, in accordance with some embodiments. As shown in FIG. 4A, after the step of FIG. 1C, block structures 162b are disposed in the recesses 161a respectively, in accordance with some embodiments. Each block structure 162b is spaced apart from inner walls of the corresponding recess 161a by a gap G, in accordance with some embodiments. In some embodiments, the thickness T3 of the block structure 162b is substantially equal to the thickness T2 of the substrate 161.

The block structures 162b are made of a material having a Young's modulus less than that of the substrate 161, in accordance with some embodiments. For example, the block structures 162b is made of an organic material, such as epoxy, silicon, resin, rubber, poly ethylene, polyimide, the like, or a combination thereof.

As shown in FIG. 4A, a filling layer 162c is filled in the gaps G and formed over the substrate 161 and the block structures 162b, in accordance with some embodiments. The filling layer 162c is made of a material having a Young's modulus less than that of the substrate 161, in accordance with some embodiments. For example, the filling layer 162c is made of an organic material, such as epoxy glue, silicon glue, resin, rubber, poly ethylene, polyimide, the like, or a combination thereof.

In some embodiments, the block structures 162b and the filling layer 162c are made of different materials. In some other embodiments, the block structures 162b and the filling layer 162c are made of the same material. The filling layer 162c is formed using a dispensing process or another suitable process, in accordance with some embodiments.

As shown in FIG. 4B, the filling layer 162c outside of the gaps G is removed, in accordance with some embodiments. The block structure 162b and the filling layer 162c remaining in the same recess 161a together form a buffer structure 162, in accordance with some embodiments.

In some embodiments, the thickness T4 of the filling layer 162c, the thickness T3 of the block structure 162b, and the thickness T2 of the substrate 161 are substantially equal to each other. In some embodiments, top surfaces 161b1, 162c1, and 162b1 of the substrate 161, the filling layer 162c, and the block structure 162b are substantially coplanar or substantially level with each other.

As shown in FIG. 4C, the step of FIG. 1E is performed to form the wiring structures 163 and 164 over the surfaces 161b1 and 161b2 of the substrate 161 respectively, in accordance with some embodiments. In this step, a wiring substrate 160 is substantially formed, in accordance with some embodiments.

FIG. 4D-1 is a top view of the chip package structure of FIG. 4D, in accordance with some embodiments. FIG. 4D is a cross-sectional view illustrating the chip package structure along a sectional line I-I' in FIG. 4D-1, in accordance with some embodiments.

As shown in FIGS. 4D and 4D-1, the steps of FIGS. 1F-1H are performed to form the chip package P, the solder bumps 150, the underfill layer 170, the adhesive layer 180, and the ring structure 190 over the wiring structure 163 and form the bumps 210 over a bottom surface 164e of the wiring structure 164, in accordance with some embodiments. In this step, a chip package structure 400 is substantially formed, in accordance with some embodiments.

One of the corners 118 of the interposer substrate 110 and adjacent one of the corners 122c of the chip structure 122 both overlap the block structure 162b thereunder, in accordance with some embodiments. As shown in FIG. 4D-1, in the buffer structure 162, the filling layer 162c surrounds the block structure 162b, in accordance with some embodiments. The filling layer 162c continuously surrounds the entire block structure 162b, in accordance with some embodiments.

Figure 5:
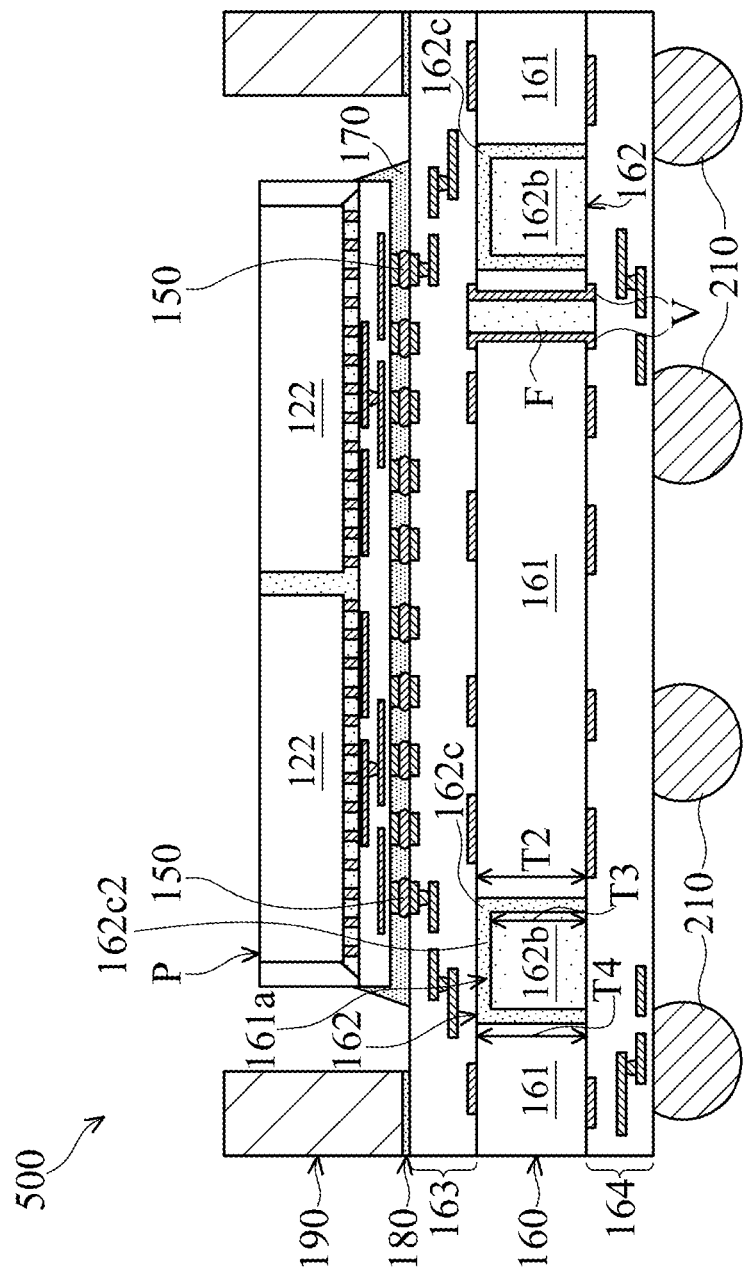
FIG. 5 is a cross-sectional view of a chip package structure, in accordance with some embodiments.

FIG. 5 is a cross-sectional view of a chip package structure 500, in accordance with some embodiments. As shown in FIG. 5, the chip package structure 500 is similar to the chip package structure 400 of FIG. 4D, except that a portion 162c2 of the filling layer 162c of the chip package structure 500 is between the block structure 162b and the wiring structure 163, in accordance with some embodiments. The portion 162c2 of the filling layer 162c covers the block structure 162b, in accordance with some embodiments.

The thickness T3 of the block structure 162b is less than the thickness T2 of the substrate 161, in accordance with some embodiments. The thickness T3 is less than the thickness T4 of the filling layer 162c, in accordance with some embodiments.

Figure 6C:
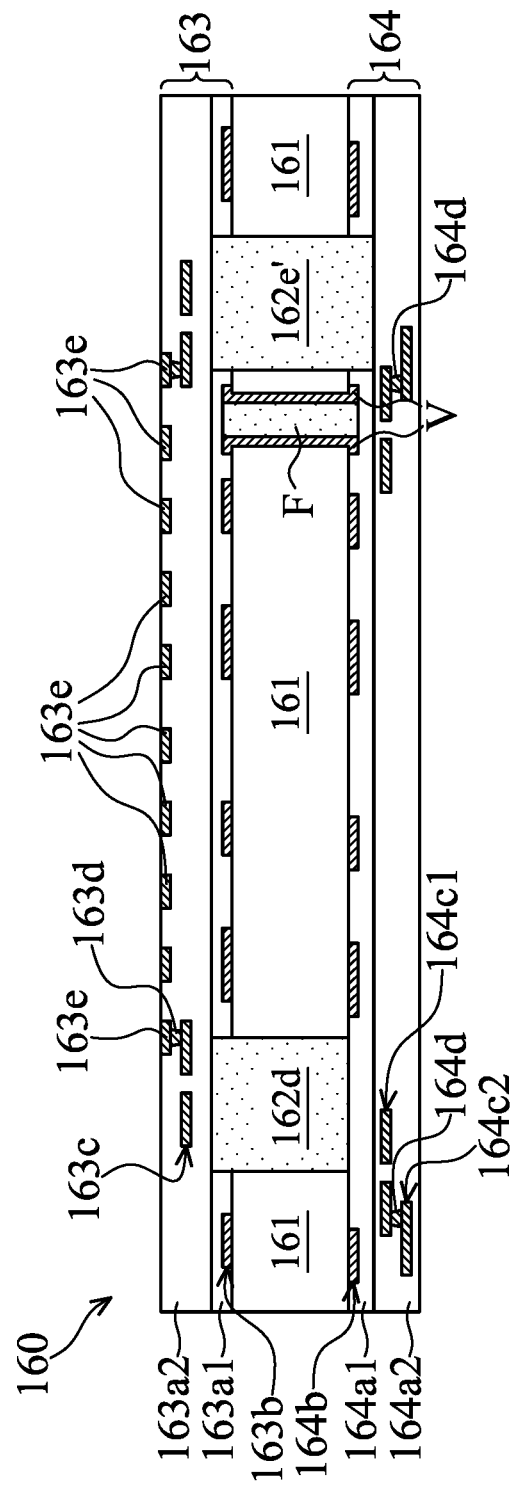

FIGS. 6A-6D are cross-sectional views of various stages of a process for forming a chip package structure, in accordance with some embodiments. As shown in FIG. 6A, a substrate 161 is provided, in accordance with some embodiments. As shown in FIG. 6A, conductive vias V and filling plugs F are formed in the substrate 161, and wiring layers 163b and 164b are formed over the surfaces 161b1 and 161b2 of the substrate 161 respectively, in accordance with some embodiments. For the sake of simplicity, FIG. 6A only shows one of the conductive vias V and one of the filling plugs F.

As shown in FIG. 6A, dielectric layers 163a1 and 164a1 are formed over the surfaces 161b1 and 161b2 of the substrate 161 respectively, in accordance with some embodiments. The dielectric layers 163a1 and 164a1 cover the wiring layers 163b and 164b respectively, in accordance with some embodiments. As shown in FIG. 6A, the substrate 161 is disposed over a carrier substrate C, in accordance with some embodiments.

As shown in FIG. 6B, portions of the dielectric layers 163a1 and 164a1 and the substrate 161 are removed to form holes H1 and through holes H2 in the substrate 161 and the dielectric layers 163a1 and 164a1, in accordance with some embodiments. The holes H1 pass through the dielectric layer 163a1 and the substrate 161, in accordance with some embodiments. The through holes H2 pass through the dielectric layers 163a1 and 164a1 and the substrate 161, in accordance with some embodiments.

As shown in FIG. 6B, buffer structures 162d and 162e' are formed in the holes H1 and the through holes H2 respectively, in accordance with some embodiments. The buffer structures 162d pass through the dielectric layer 163a1 and the substrate 161, in accordance with some embodiments.

The buffer structures 162e' pass through the dielectric layers 163a1 and 164a1 and the substrate 161, in accordance with some embodiments. The buffer structures 162d and 162e' are made of a material the same as or similar to that of the buffer structures 162 of the FIG. 1H, in accordance with some embodiments.

The thickness T5 of the buffer structure 162d is greater than the thickness T2 of the substrate 161, in accordance with some embodiments. The thickness T6 of the buffer structure 162e' is greater than the thickness T5, in accordance with some embodiments.

As shown in FIG. 6C, the carrier substrate C is removed, in accordance with some embodiments. As shown in FIG. 6C, a dielectric layer 163a2, wiring layers 163c, conductive vias 163d, and conductive pads 163e are formed over the dielectric layer 163a1, in accordance with some embodiments. For the sake of simplicity, FIG. 6C only shows one of the wiring layers 163c, in accordance with some embodiments.

The wiring layers 163c, conductive vias 163d, and conductive pads 163e are in the dielectric layer 163a2, in accordance with some embodiments. The conductive vias 163d are electrically connected between different wiring layers 163c or between the wiring layers 163c and the conductive pads 163e, in accordance with some embodiments.

The wiring layers 163c and 163b are electrically connected to each other through conductive vias (not shown), in accordance with some embodiments. The dielectric layers 163a1 and 163a2, the wiring layers 163b and 163c, the conductive vias 163d, and the conductive pads 163e together form a wiring structure 163, in accordance with some embodiments.

As shown in FIG. 6C, a dielectric layer 164a2 and wiring layers 164c1 and 164c2, and conductive vias 164d are formed over the dielectric layer 164a1, in accordance with some embodiments. The wiring layers 164c1 and 164c2 and the conductive vias 164d are in the dielectric layer 164a2, in accordance with some embodiments.

The conductive vias 164d are electrically connected between the wiring layers 164c1 and 164c2, in accordance with some embodiments. The wiring layers 164c1, 164c2, and 164b are electrically connected to each other, in accordance with some embodiments. The dielectric layers 164a1 and 164a2, the wiring layers 164b, 164c1, and 164c2, and the conductive vias 164d together form a wiring structure 164, in accordance with some embodiments.

Figure 6D:
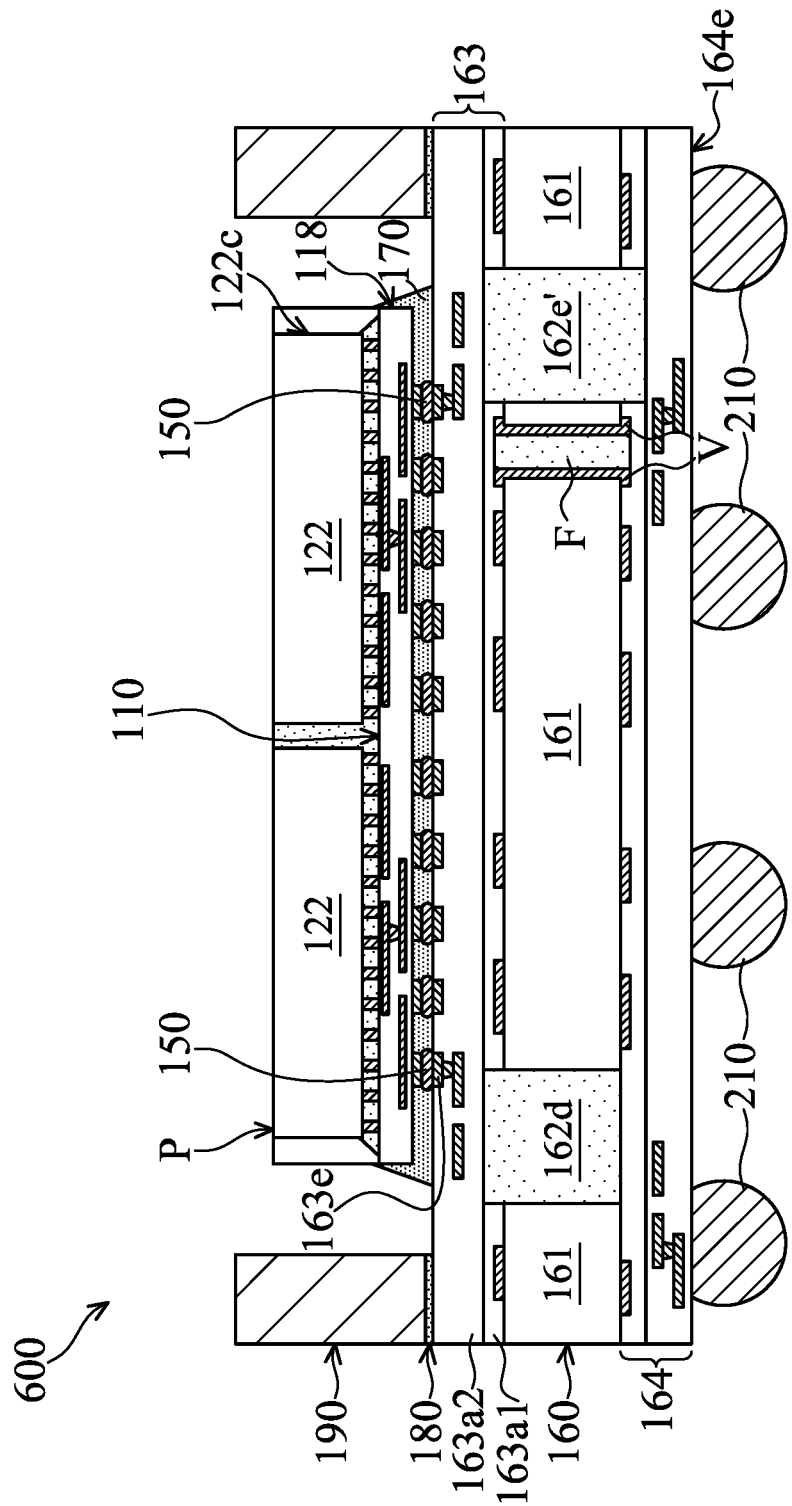

As shown in FIG. 6D, the steps of FIGS. 1F-1H are performed to form the chip package P, the solder bumps 150, the underfill layer 170, the adhesive layer 180, and the ring structure 190 over the wiring structure 163 and form the bumps 210 over a bottom surface 164e of the wiring structure 164, in accordance with some embodiments. In this step, a chip package structure 600 is substantially formed, in accordance with some embodiments.

Figure 7D:
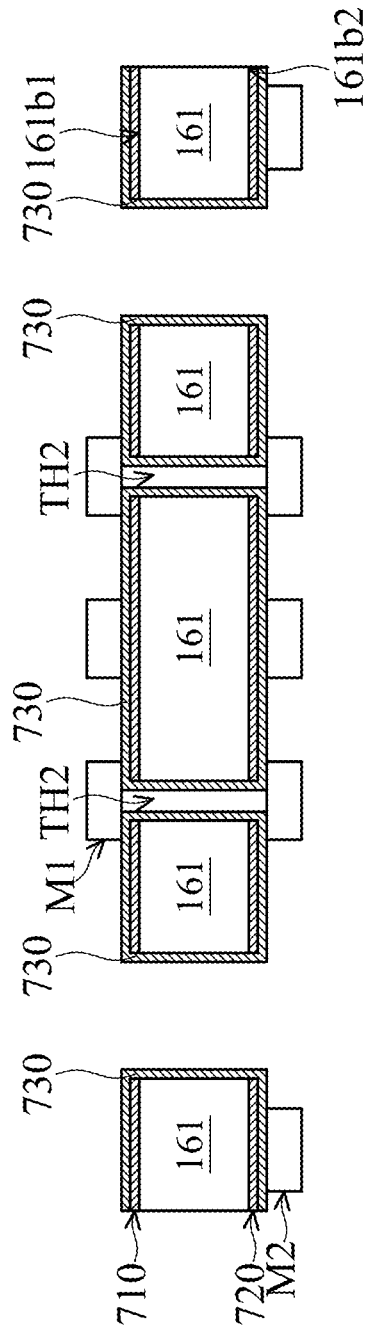

FIGS. 7A-7H are cross-sectional views of various stages of a process for forming a chip package structure, in accordance with some embodiments. As shown in FIG. 7A, a substrate 161 is provided, in accordance with some embodiments. As shown in FIG. 7A, conductive layers 710 and 720 are formed over opposite surfaces 161b1 and 161b2 of the substrate 161 respectively, in accordance with some embodiments.

The conductive layers 710 and 720 are made of a conductive material, such as metal (e.g. copper, aluminum, or tungsten) or alloys thereof, in accordance with some embodiments. In some embodiments, the conductive layers 710 and 720 are copper foils.

As shown in FIG. 7B, portions of the conductive layers 710 and 720 and the substrate 161 are removed to form through holes TH1 and TH2 in the conductive layers 710 and 720 and the substrate 161, in accordance with some embodiments. The through hole TH1 is wider than the through hole TH2, in accordance with some embodiments. That is, the width W1 of the through hole TH1 is greater than the width W2 of the through hole TH2, in accordance with some embodiments. The removal process includes a drilling process, such as a laser drilling process, in accordance with some embodiments.

As shown in FIG. 7C, a conductive layer 730 is formed over the inner walls S1 and S2 of the through holes TH1 and TH2, in accordance with some embodiments. The conductive layer 730 is further formed over the conductive layers 710 and 720, in accordance with some embodiments.

The conductive layer 730 is made of a conductive material, such as metal (e.g. copper, aluminum, or tungsten), alloys thereof, or another suitable material. The conductive layer 730 is formed using an electroless plating process and a plating process, in accordance with some embodiments.

As shown in FIG. 7D, mask layers M1 and M2 are formed over the conductive layer 730 covering the conductive layers 710 and 720, in accordance with some embodiments. In some embodiments, portions of the mask layers M1 and M2 cover the through holes TH2, in accordance with some embodiments. The mask layers M1 and M2 are made of an organic material, such as a polymer material, or another suitable material, which is different from the material of the conductive layers 710, 720 and 730, in accordance with some embodiments.

Figure 7E:
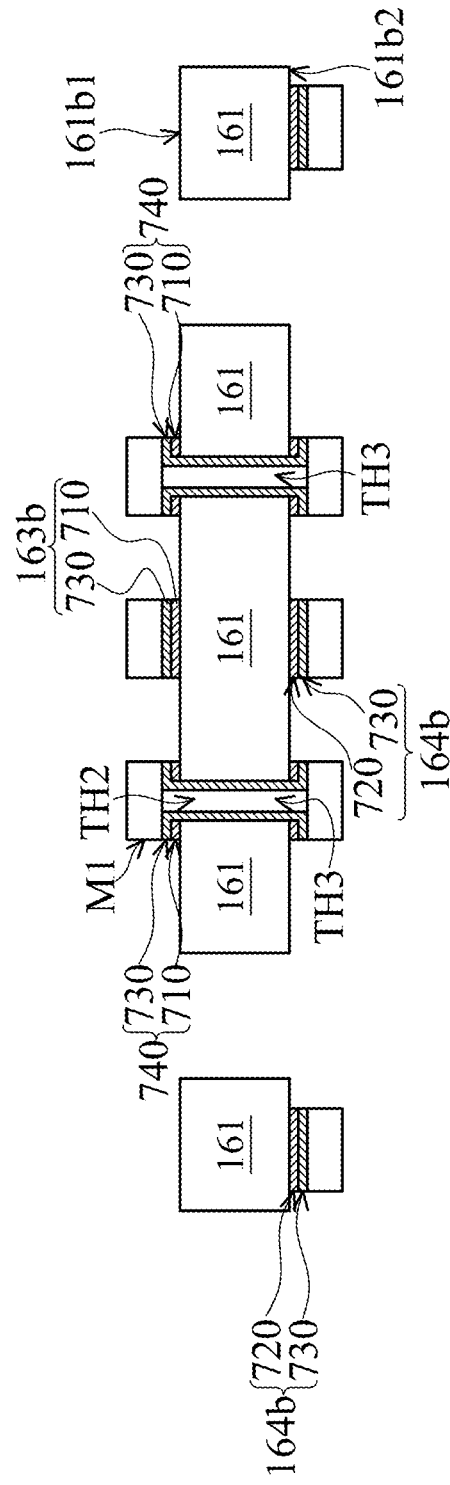

As shown in FIG. 7E, portions of the conductive layers 710, 720 and 730, which are not covered by the mask layers M1 and M2 are removed, in accordance with some embodiments. The conductive layers 710 and 730 remaining over the surface 161b1 of the substrate 161 together form a wiring layer 163b, in accordance with some embodiments. The conductive layers 720 and 730 remaining over the surface 161b2 of the substrate 161 together form a wiring layer 164b, in accordance with some embodiments.

The conductive layer 730 remaining in one of the through holes TH2 and remaining over the surfaces 161b1 and 161b2 close to the one of the through holes TH2 and the conductive layers 720 and 730 under the conductive layer 730 together form a conductive via structure 740, in accordance with some embodiments. Each conductive via structure 740 has a through hole TH3, in accordance with some embodiments.

Figure 7F:
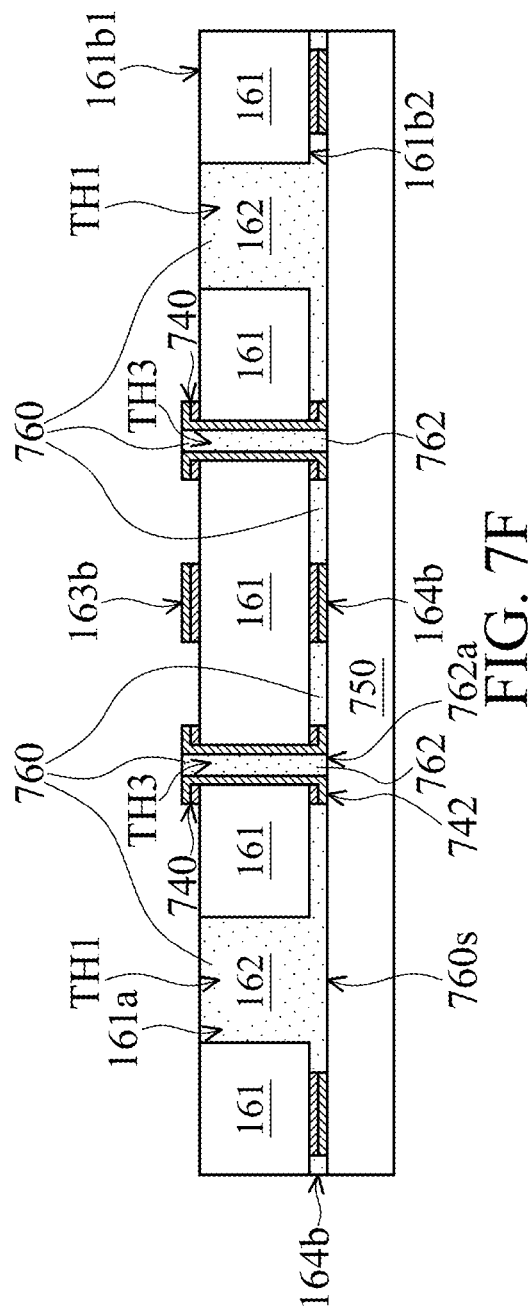

As shown in FIG. 7F, the mask layers M1 and M2 are removed, in accordance with some embodiments. As shown in FIG. 7F, the substrate 161 is disposed over a carrier substrate 750, in accordance with some embodiments. As shown in FIG. 7F, a buffer layer 760 is formed in the through holes TH1 and TH3 and between the substrate 161 and the carrier substrate 750, in accordance with some embodiments.

The buffer layer 760 in the through holes TH1 forms the buffer structures 162, in accordance with some embodiments. The buffer layer 760 in the through holes TH3 forms filling plugs 762, in accordance with some embodiments.

The filling plug 762 is thicker than the buffer structure 162, in accordance with some embodiments. In some embodiments, a bottom surface 760s of the buffer layer 760, a bottom surface 742 of the conductive via structure 740, and a bottom surface 762a of the filling plug 762 are substantially coplanar.

Figure 7G:
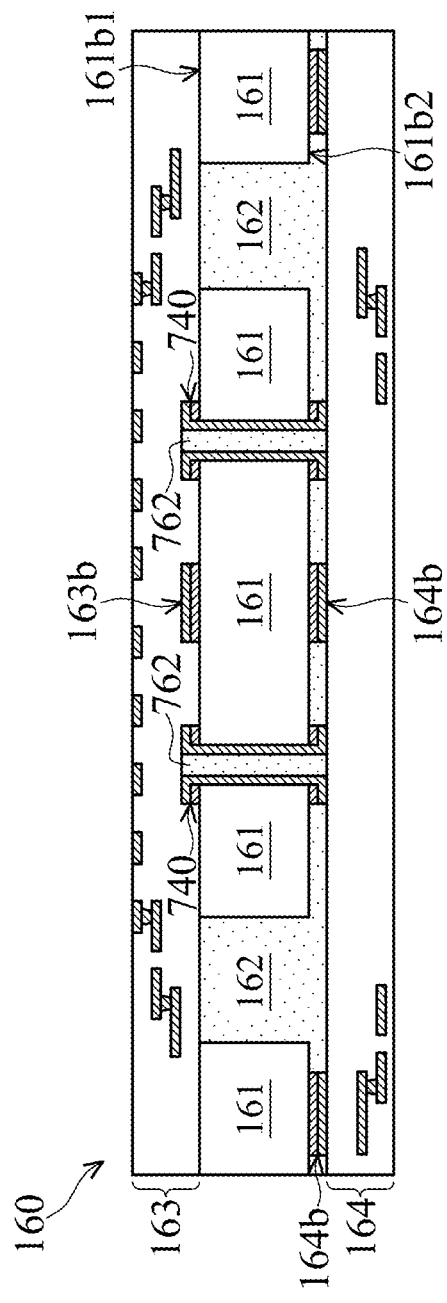

As shown in FIG. 7G, the step of FIG. 1E is performed to form the wiring structures 163 and 164 over the surfaces 161b1 and 161b2 of the substrate 161 respectively, in accordance with some embodiments. In this step, a wiring substrate 160 is substantially formed, in accordance with some embodiments.

Figure 7H:
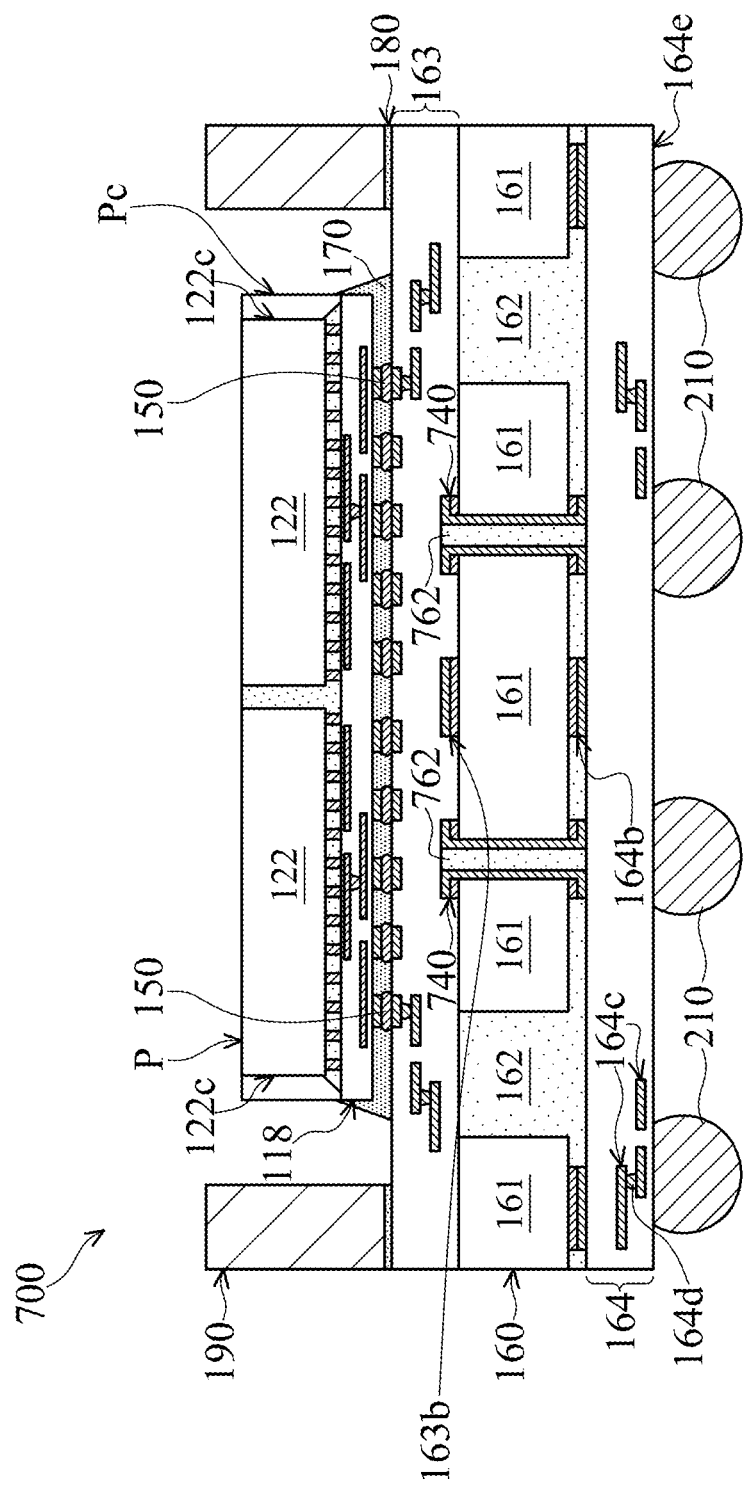
Figures 1, 7H:
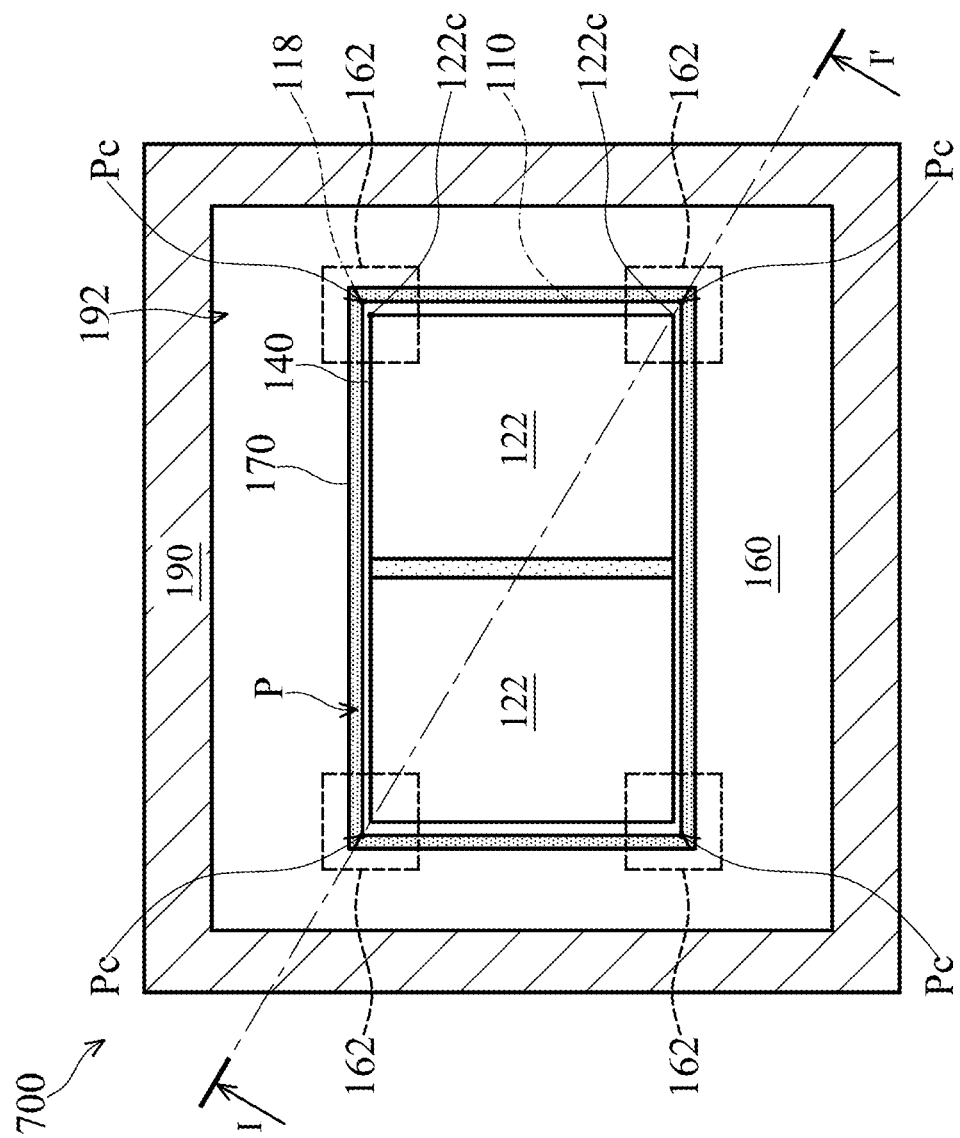

FIG. 7H-1 is a top view of the chip package structure of FIG. 7H, in accordance with some embodiments. As shown in FIGS. 7H and 7H-1, the steps of FIGS. 1F-1H are performed to form the chip package P, the solder bumps 150, the underfill layer 170, the adhesive layer 180, and the ring structure 190 over the wiring structure 163 and form the bumps 210 over a bottom surface 164e of the wiring structure 164, in accordance with some embodiments. In this step, a chip package structure 700 is substantially formed, in accordance with some embodiments.

Figure 8A:
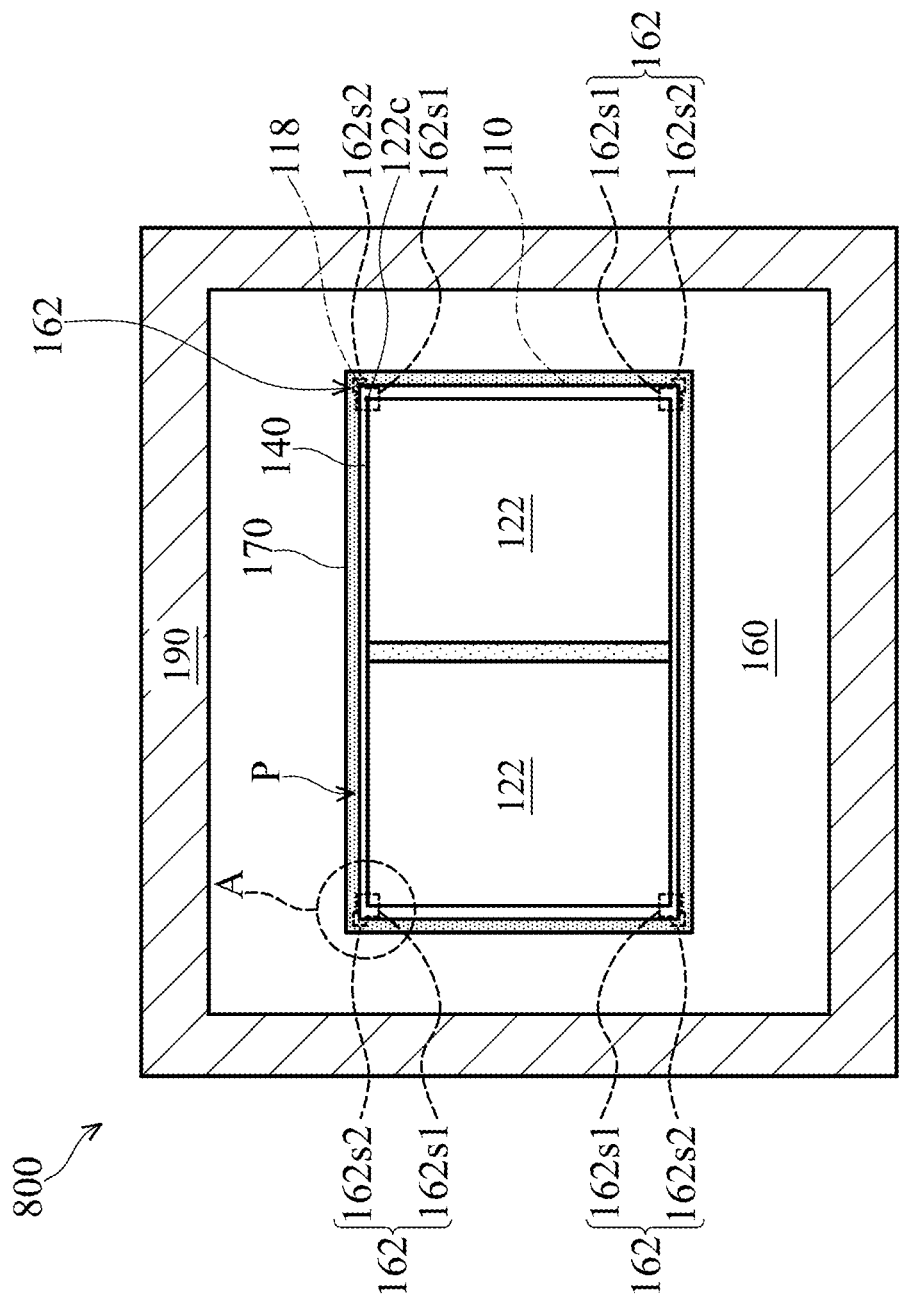
FIG. 8A is a top view of a chip package structure, in accordance with some embodiments.
Figure 8B:
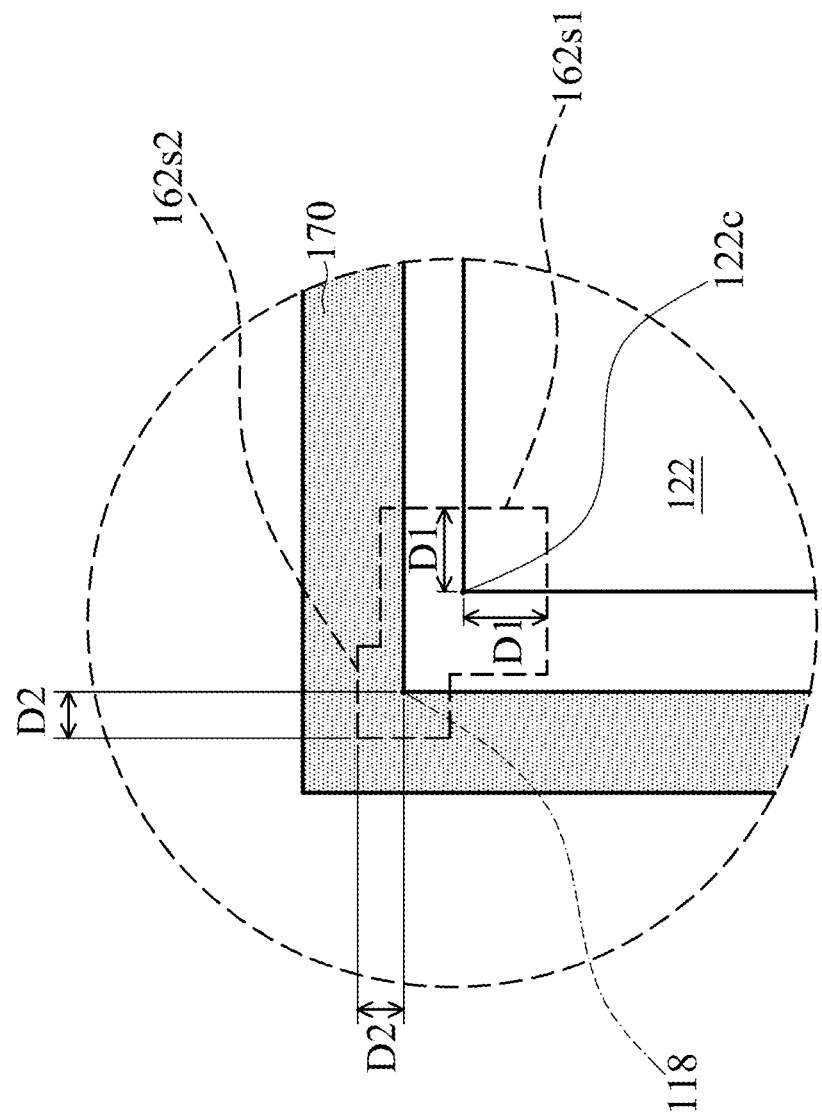
FIG. 8B is an enlarged view of a region A of the chip package structure of FIG. 8A, in accordance with some embodiments.

FIG. 8A is a top view of a chip package structure 800, in accordance with some embodiments. FIG. 8B is an enlarged view of a region A of the chip package structure 800 of FIG. 8A, in accordance with some embodiments. As shown in FIGS. 8A and 8B, the chip package structure 800 is similar to the chip package structure 100 of FIG. 1H, except that the buffer structures 162 of the chip package structure 800 has a double square shape, in accordance with some embodiments. Each buffer structure 162 has a first square portion 162s1 and a second square portion 162s2, in accordance with some embodiments.

The corner 122c of the chip structure 122 overlaps the first square portion 162s1, in accordance with some embodiments. In some embodiments, the corner 122c is over a center of the first square portion 162s1. The corner 118 of the interposer substrate 110 overlaps the second square portion 162s2, in accordance with some embodiments. In some embodiments, the corner 118 is over a center of the second square portion 162s2.

In some embodiments, a distance D1 between the corner 122c and an edge of the first square portion 162s1 ranges from about 0.05 mm to about 40 mm, in accordance with some embodiments. The distance D1 ranges from about 0.5 mm to about 40 mm, in accordance with some embodiments.

In some embodiments, a distance D2 between the corner 118 and an edge of the second square portion 162s2 ranges from about 0.01 mm to about 10 mm, in accordance with some embodiments. The distance D2 ranges from about 0.5 mm to about 10 mm, in accordance with some embodiments.

Figure 9:
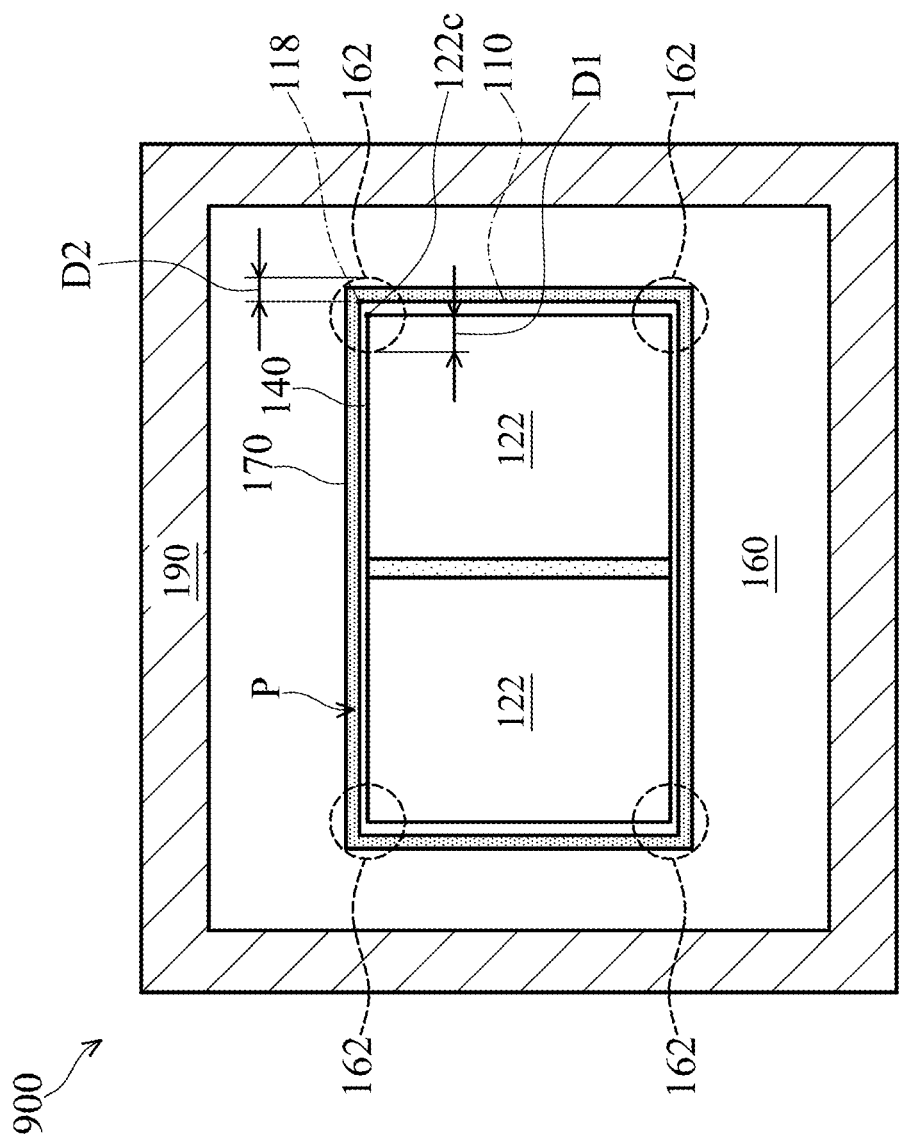
FIG. 9 is a top view of a chip package structure, in accordance with some embodiments.

FIG. 9 is a top view of a chip package structure 900, in accordance with some embodiments. As shown in FIG. 9, the chip package structure 900 is similar to the chip package structure 100 of FIG. 1H, except that the buffer structures 162 of the chip package structure 900 has a round shape, in accordance with some embodiments.

In some embodiments, a distance D1 between the corner 122c and an edge of the buffer structure 162 thereunder ranges from about 0.05 mm to about 40 mm, in accordance with some embodiments. The distance D1 ranges from about 0.5 mm to about 40 mm, in accordance with some embodiments.

In some embodiments, a distance D2 between the corner 118 and an edge of the buffer structure 162 thereunder ranges from about 0.01 mm to about 10 mm, in accordance with some embodiments. The distance D2 ranges from about 0.5 mm to about 10 mm, in accordance with some embodiments. The corner 122c is over a center of the buffer structure 162 thereunder, in accordance with some embodiments.

Figure 10A:
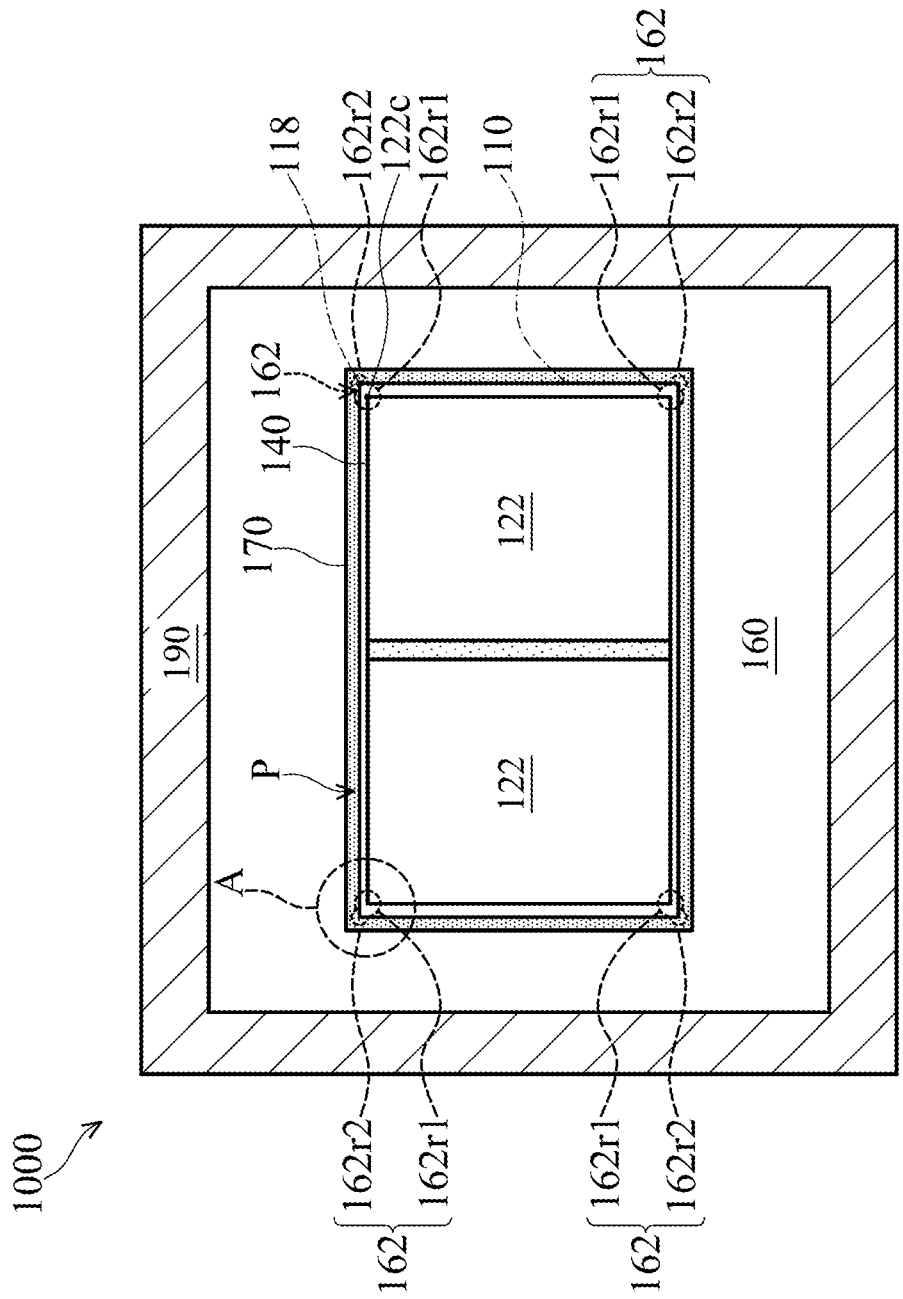
FIG. 10A is a top view of a chip package structure, in accordance with some embodiments.
Figure 10B:
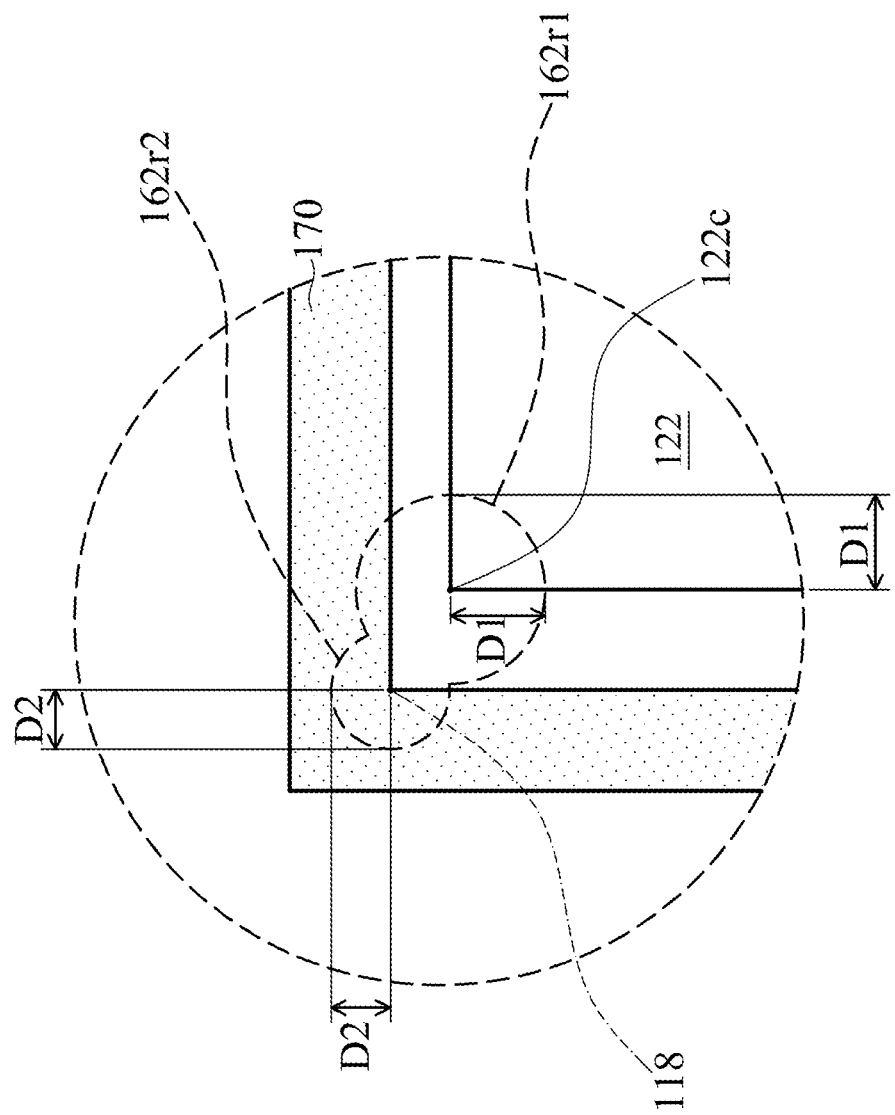
FIG. 10B is an enlarged view of a region A of the chip package structure of FIG. 10A, in accordance with some embodiments.

FIG. 10A is a top view of a chip package structure 1000, in accordance with some embodiments. FIG. 10B is an enlarged view of a region A of the chip package structure 1000 of FIG. 10A, in accordance with some embodiments.

As shown in FIGS. 10A and 10B, the chip package structure 1000 is similar to the chip package structure 100 of FIG. 1H, except that the buffer structures 162 of the chip package structure 1000 has a double round shape, in accordance with some embodiments. Each buffer structure 162 has a first round portion 162r1 and a second round portion 162r2, in accordance with some embodiments.

The corner 122c of the chip structure 122 overlaps the first round portion 162r1, in accordance with some embodiments. In some embodiments, the corner 122c is over a center of the first round portion 162r1. The corner 118 of the interposer substrate 110 overlaps the second round portion 162r2, in accordance with some embodiments. In some embodiments, the corner 118 is over a center of the second round portion 162r2.

In some embodiments, a distance D1 between the corner 122c and an edge of the first round portion 162r1 ranges from about 0.05 mm to about 40 mm, in accordance with some embodiments. The distance D1 ranges from about 0.5 mm to about 40 mm, in accordance with some embodiments.

In some embodiments, a distance D2 between the corner 118 and an edge of the second round portion 162r2 ranges from about 0.01 mm to about 10 mm, in accordance with some embodiments. The distance D2 ranges from about 0.5 mm to about 10 mm, in accordance with some embodiments.

Figure 11:
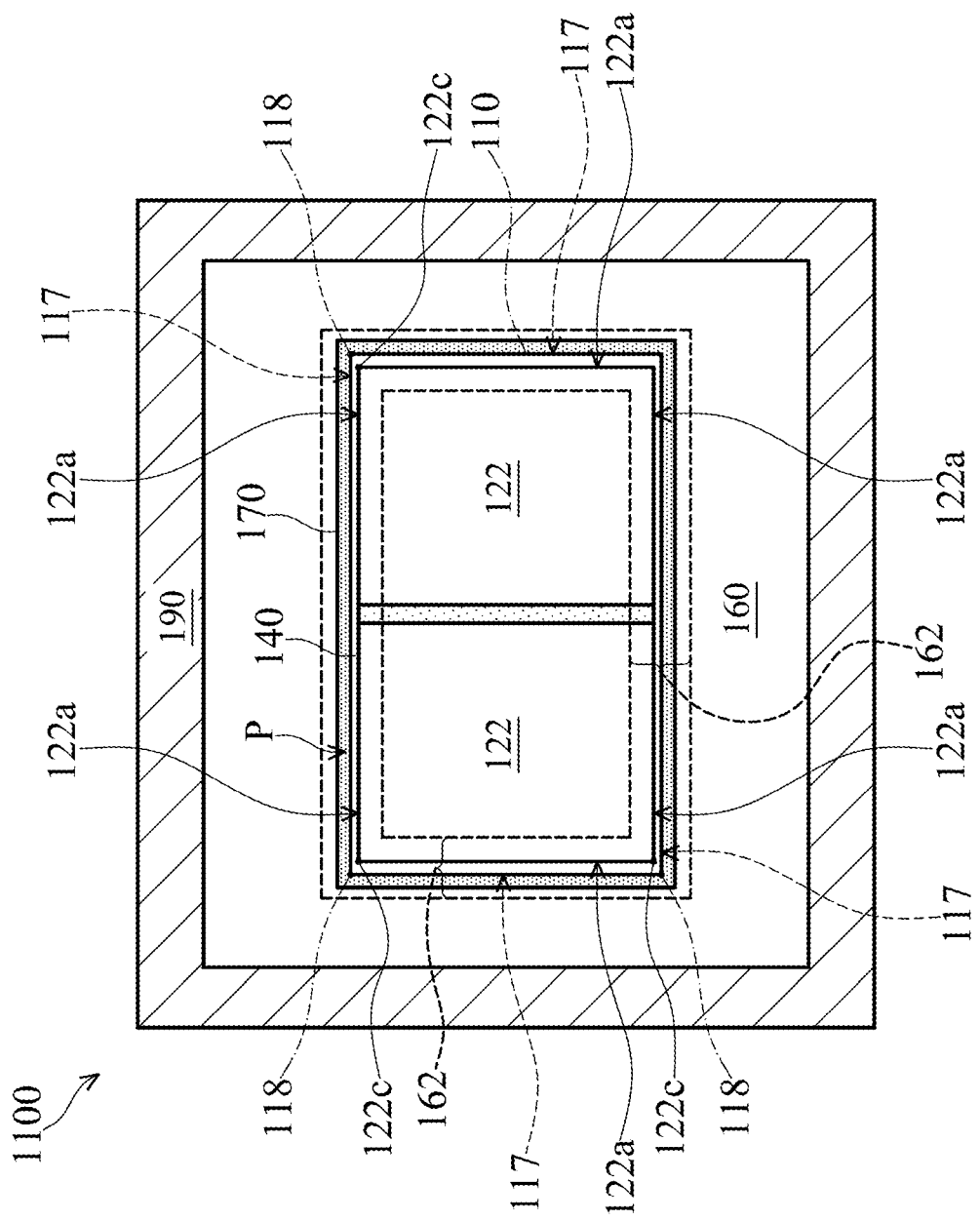
FIG. 11 is a top view of a chip package structure, in accordance with some embodiments.

FIG. 11 is a top view of a chip package structure 1100, in accordance with some embodiments. As shown in FIG. 11, the chip package structure 1100 is similar to the chip package structure 100 of FIG. 1H, except that the buffer structure 162 of the chip package structure 1100 has a ring shape, in accordance with some embodiments.

Each corner 122c is between two adjacent sidewalls 122a, in accordance with some embodiments. Each corner 118 is between two adjacent sidewalls 117, in accordance with some embodiments. The buffer structure 162 overlaps the corners 122c and 118, in accordance with some embodiments. The buffer structure 162 overlaps the entire sidewalls 122a of the chip structures 122 and the entire sidewalls 117 of the interposer substrate 110, in accordance with some embodiments.

Figure 12:
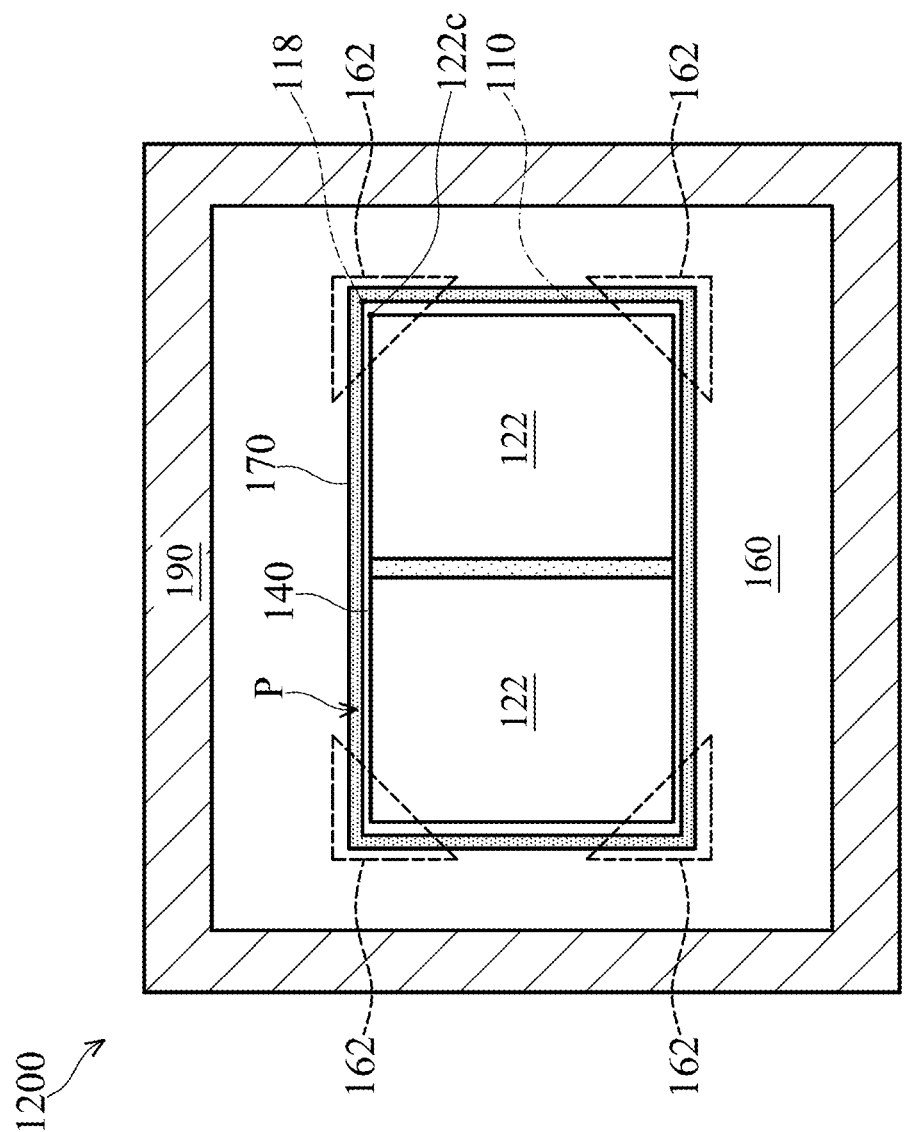
FIG. 12 is a top view of a chip package structure, in accordance with some embodiments.

FIG. 12 is a top view of a chip package structure 1200, in accordance with some embodiments. As shown in FIG. 12, the chip package structure 1200 is similar to the chip package structure 100 of FIG. 1H, except that the buffer structure 162 of the chip package structure 1100 has a triangle shape, in accordance with some embodiments.

Figure 13:
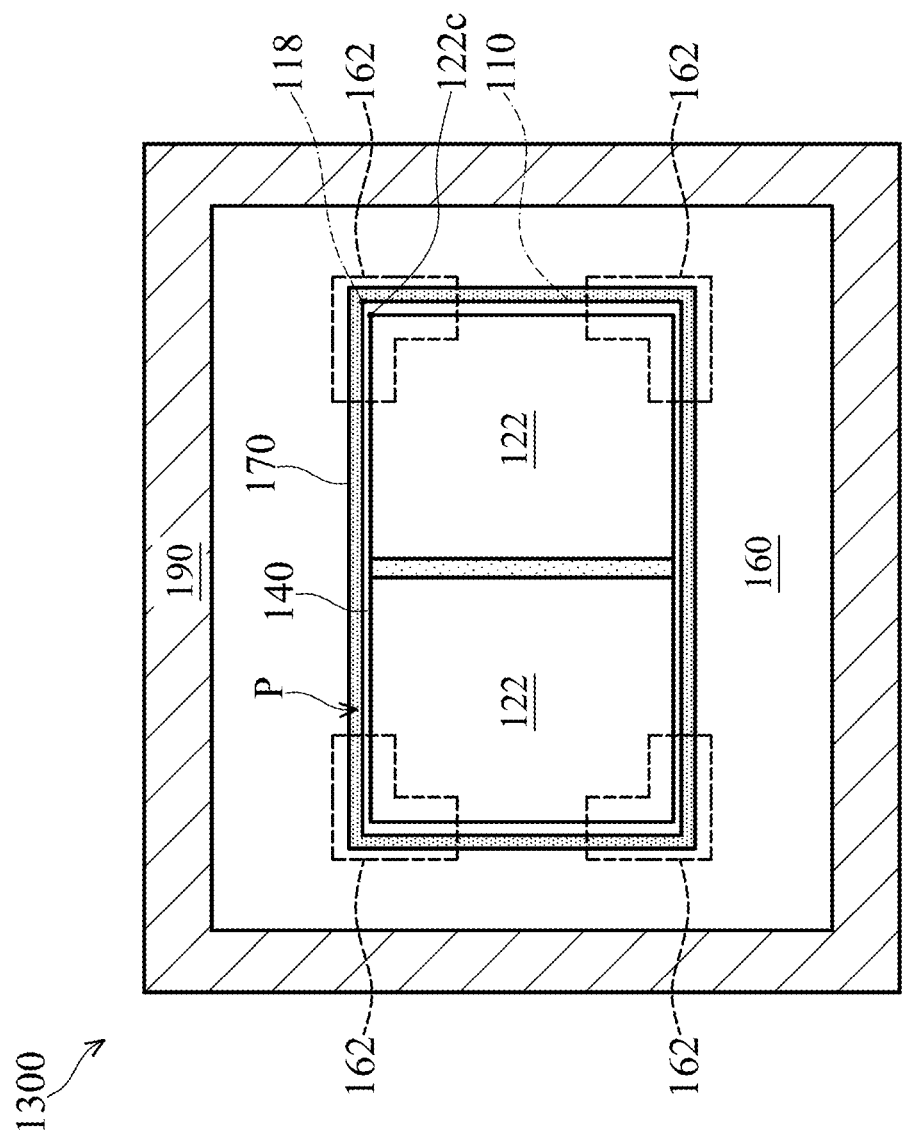
FIG. 13 is a top view of a chip package structure, in accordance with some embodiments.

FIG. 13 is a top view of a chip package structure 1300, in accordance with some embodiments. As shown in FIG. 13, the chip package structure 1300 is similar to the chip package structure 100 of FIG. 1H, except that the buffer structure 162 of the chip package structure 1300 has an L-like shape, in accordance with some embodiments.

Figure 14:
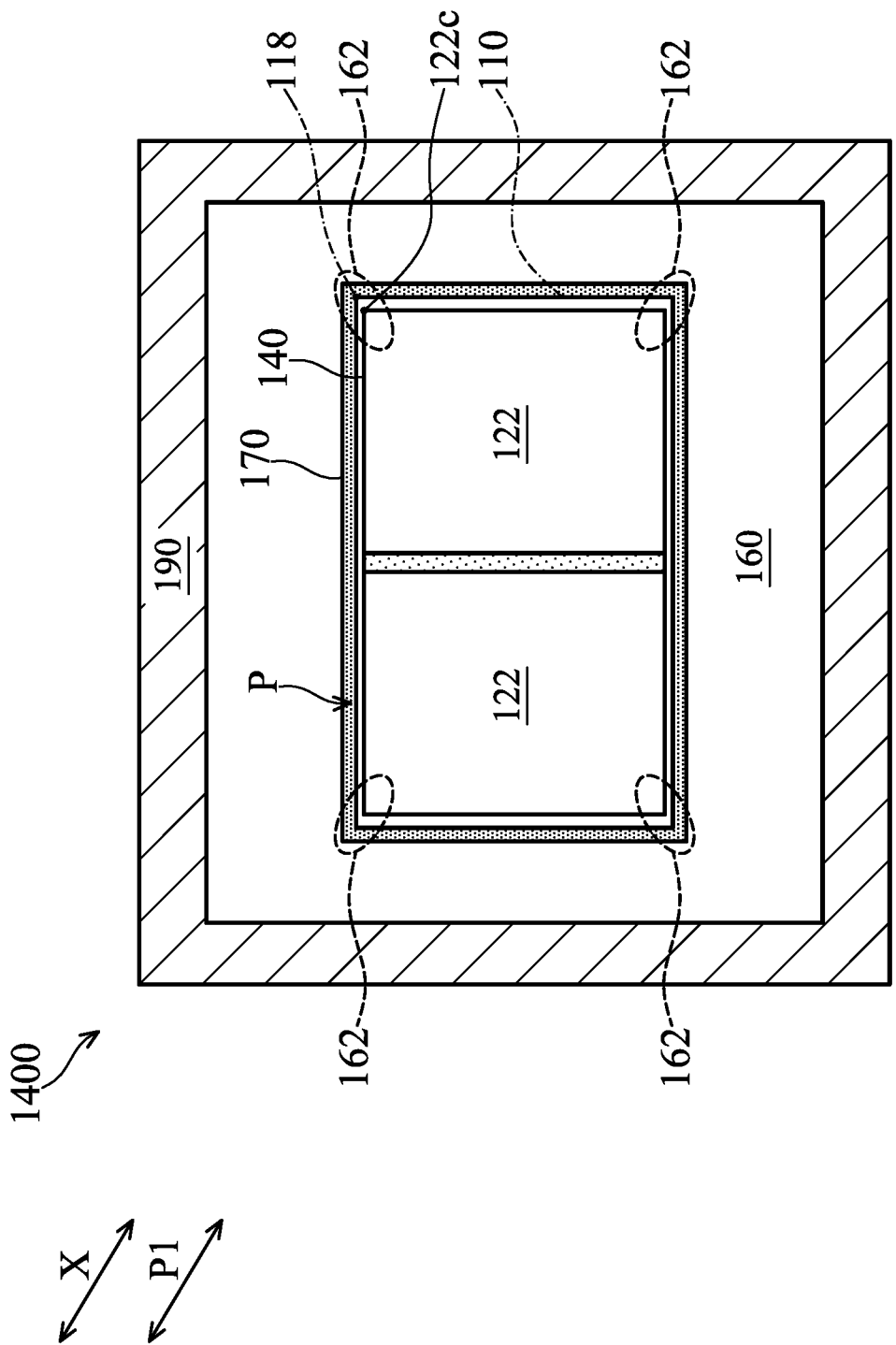
FIG. 14 is a top view of a chip package structure, in accordance with some embodiments.

FIG. 14 is a top view of a chip package structure 1400, in accordance with some embodiments. As shown in FIG. 14, the chip package structure 1400 is similar to the chip package structure 100 of FIG. 1H, except that the buffer structures 162 of the chip package structure 1400 has an oval-like shape, in accordance with some embodiments. The long axis X of each buffer structure 162 is substantially parallel to the diagonal axis P1 of the chip package P (or the interposer substrate 110), in accordance with some embodiments.

Figure 15C:
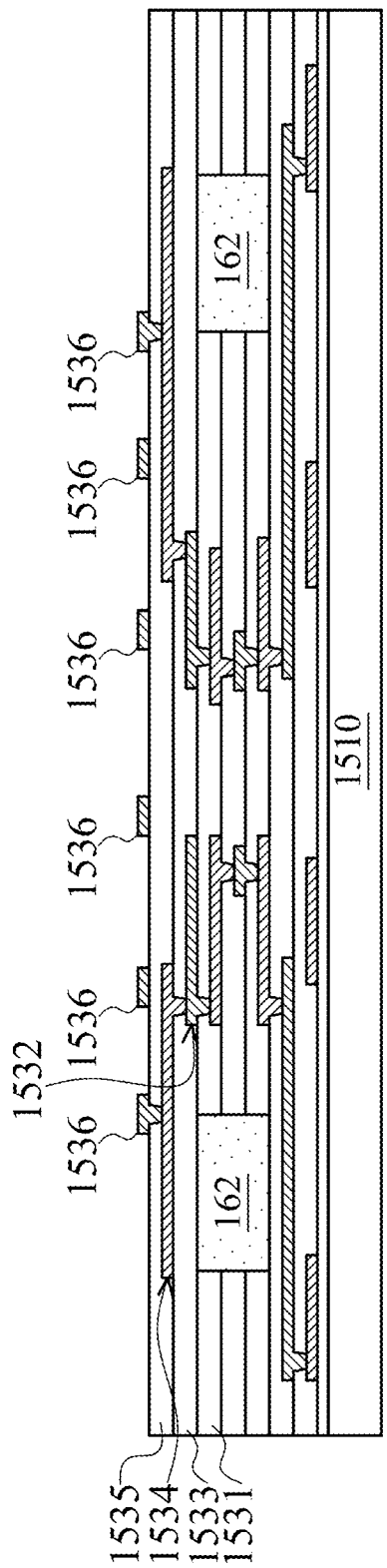

FIGS. 15A-15E are cross-sectional views of various stages of a process for forming a chip package structure, in accordance with some embodiments. As shown in FIG. 15A, a carrier substrate 1510 is provided, in accordance with some embodiments. As shown in FIG. 15A, a seed layer 1521 is formed over the carrier substrate 1510, in accordance with some embodiments. The seed layer 1521 is made of a conductive material, such as metal (e.g. copper, aluminum, or nickel) or alloys thereof, in accordance with some embodiments.

As shown in FIG. 15A, conductive pads 1522, a dielectric layer 1523, a wiring layer 1524, a dielectric layer 1525, a wiring layer 1526, a dielectric layer 1527, a wiring layer 1528, a dielectric layer 1529, a wiring layer 1530, a dielectric layer 1531, and a wiring layer 1532 are sequentially formed over the seed layer 1521, in accordance with some embodiments. The conductive pads 1522 and the wiring layers 1524, 1526, 1528, 1530, and 1532 are electrically connected to each other, in accordance with some embodiments.

The conductive pads 1522 and the wiring layers 1524, 1526, 1528, 1530, and 1532 are made of a conductive material, such as metal (e.g. copper, aluminum, or tungsten) or alloys thereof, in accordance with some embodiments. The dielectric layers 1523, 1525, 1527, 1529 and 1531 are made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments.

As shown in FIG. 15B, portion of the dielectric layers 1527, 1529 and 1531 are removed to form holes H3 passing through the dielectric layers 1527, 1529 and 1531, in accordance with some embodiments. The removal process includes a drilling process (e.g., a laser drilling process) or a photolithography process and an etching process, in accordance with some embodiments.

As shown in FIG. 15B, buffer structures 162 are formed in the holes H3, in accordance with some embodiments. The dielectric layers 1527, 1529 and 1531 together form a dielectric structure D, in accordance with some embodiments. The Young's modulus of the buffer structures 162 is less than the Young's modulus of the dielectric structure D, in accordance with some embodiments.

As shown in FIG. 15C, a dielectric layer 1533, a wiring layer 1534, a dielectric layer 1535, and conductive pads 1536 are sequentially formed over the dielectric layer 1531, the wiring layer 1532, and the buffer structures 162, in accordance with some embodiments. The wiring layer 1532 and 1534 and the conductive pads 1536 are electrically connected to each other, in accordance with some embodiments.

Figure 15D:
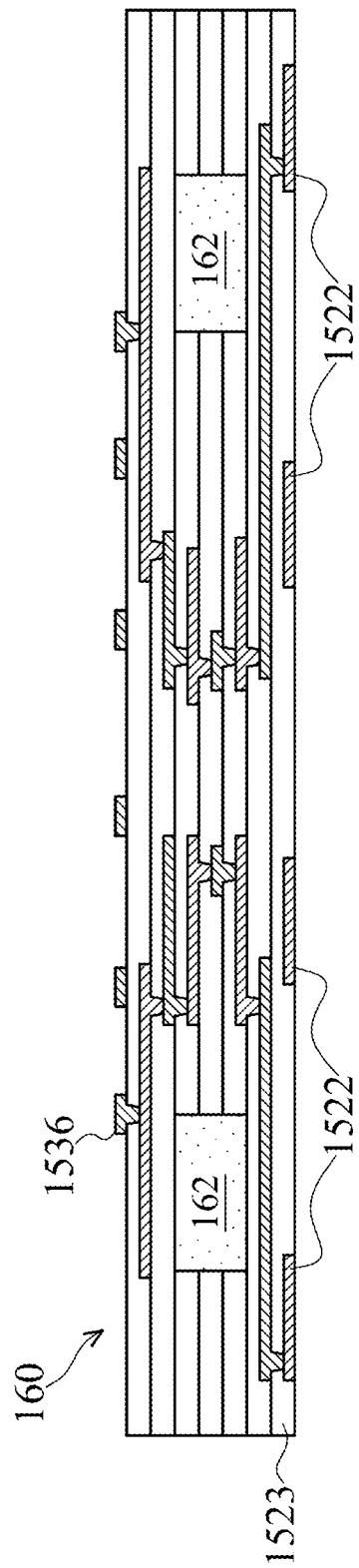

As shown in FIG. 15D, the carrier substrate 1510 and the seed layer 1521 are removed, in accordance with some embodiments. In this step, a wiring substrate 160 is substantially formed, in accordance with some embodiments. The wiring substrate 160 is a coreless substrate, in accordance with some embodiments.

Figure 15E:
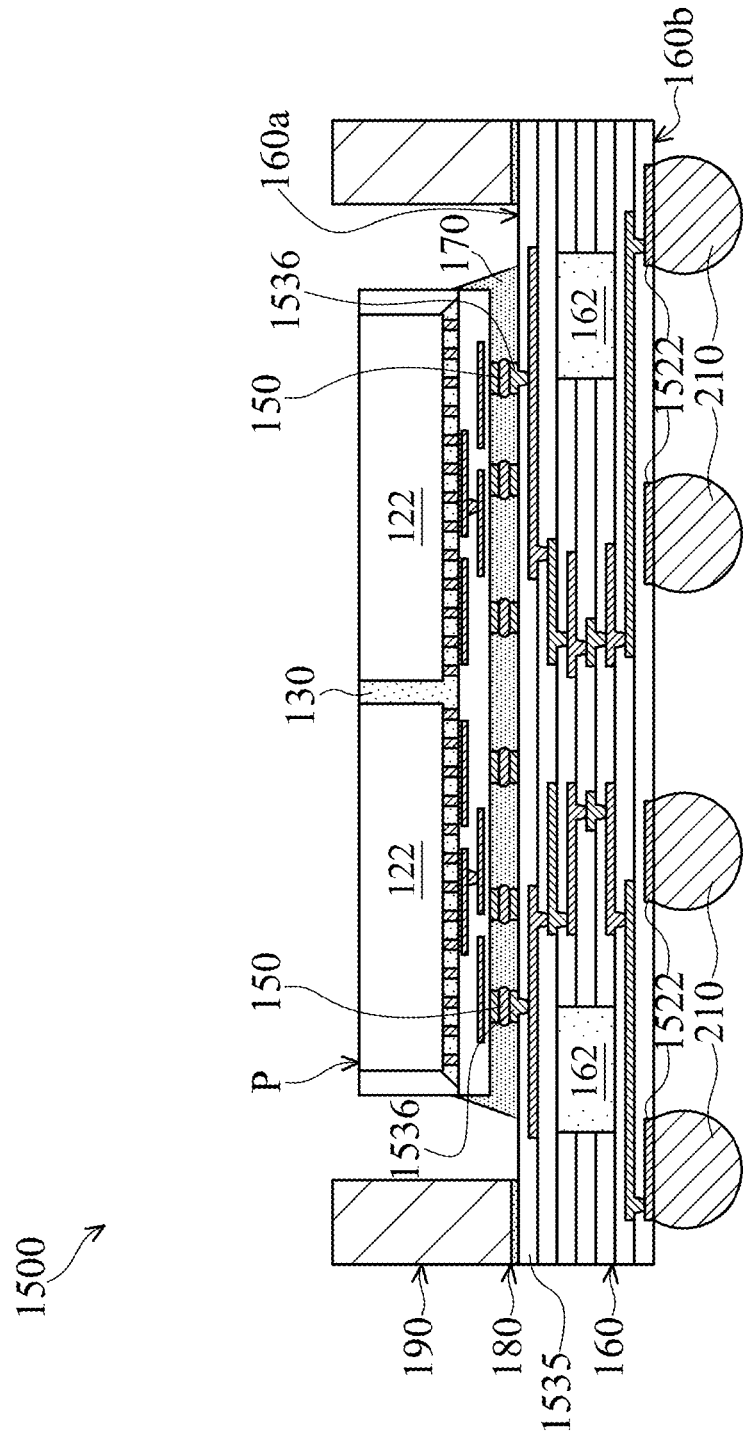
Figures 1, 15E:
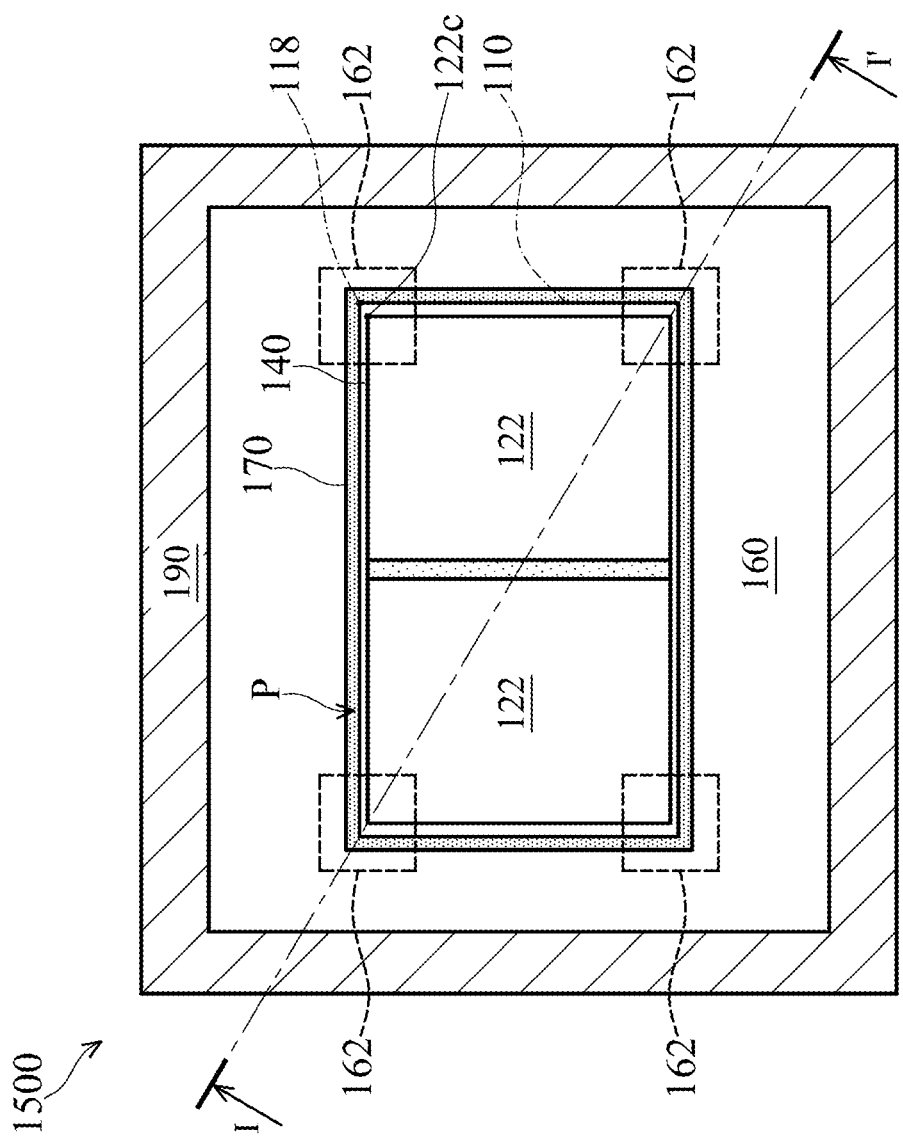

FIG. 15E-1 is a top view of the chip package structure of FIG. 15E, in accordance with some embodiments. FIG. 15E is a cross-sectional view illustrating the chip package structure along a sectional line I-I' in FIG. 15E-1, in accordance with some embodiments.

As shown in FIGS. 15E and 15E-1, the steps of FIGS. 1F-1H are performed to form the chip package P, the solder bumps 150, the underfill layer 170, the adhesive layer 180, and the ring structure 190 over a top surface 160a of the wiring substrate 160 and form the bumps 210 over a bottom surface 160b of the wiring substrate 160, in accordance with some embodiments.

The solder bumps 150 are connected to the conductive pads 1536, in accordance with some embodiments. The bumps 210 are connected to the conductive pads 1522, in accordance with some embodiments. In this step, a chip package structure 1500 is substantially formed, in accordance with some embodiments.

Figure 16:
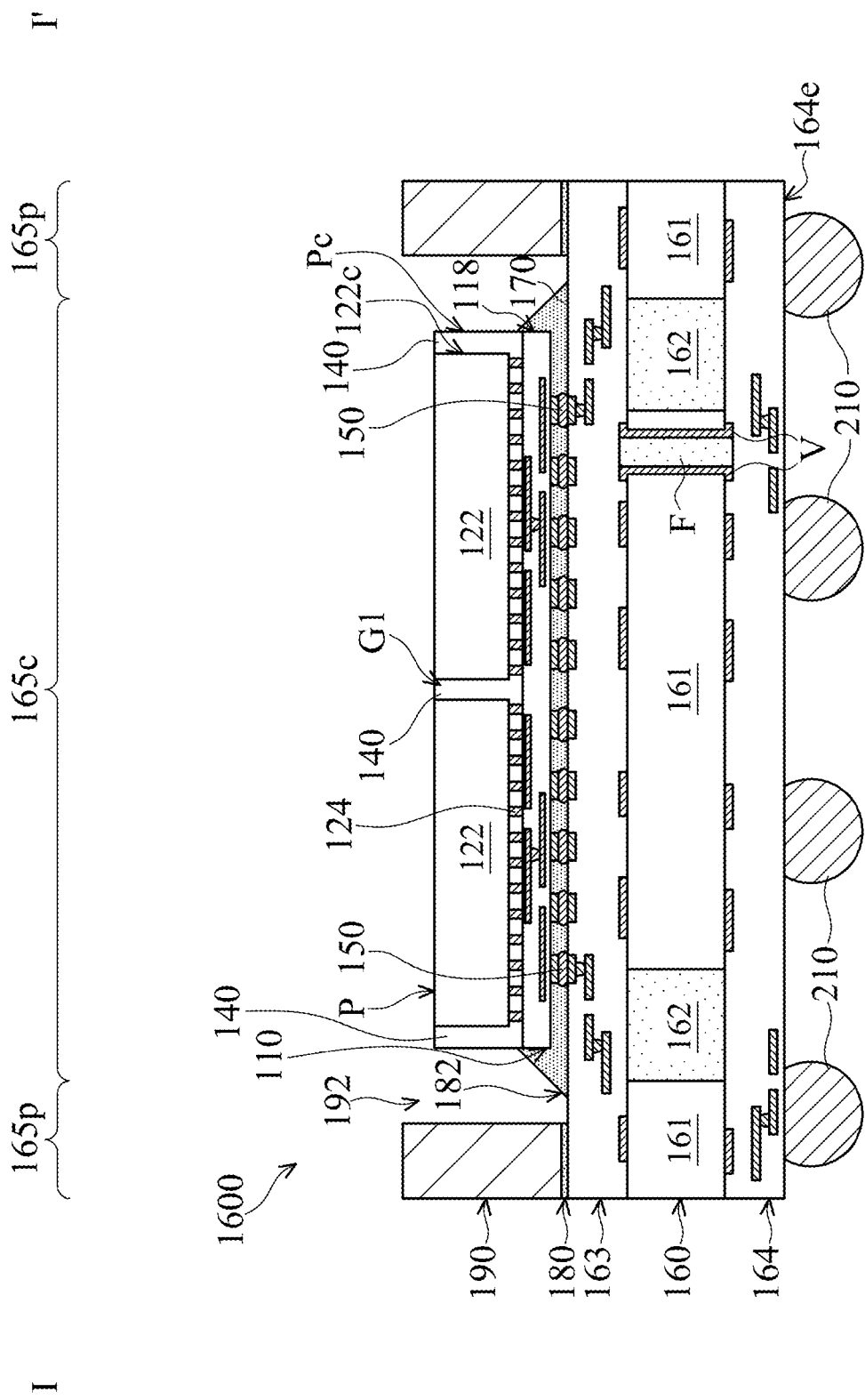
FIG. 16 is a cross-sectional view of a chip package structure, in accordance with some embodiments.

FIG. 16 is a cross-sectional view of a chip package structure 1600, in accordance with some embodiments. As shown in FIG. 16, the chip package structure 1600 is similar to the chip package structure 100 of FIG. 1H, except that the chip package structure 1600 does not have the underfill layer 130 of the chip package structure 100 of FIG. 1H, in accordance with some embodiments.

In the chip package structure 1600, the molding layer 140 is between the chip structures 122 and the interposer substrate 110, in accordance with some embodiments. The molding layer 140 surrounds the conductive pillars 124 and the chip structures 122, in accordance with some embodiments. The molding layer 140 extends into the gap G1 between the chip structures 122, in accordance with some embodiments. The gap G1 is filled with the molding layer 140, in accordance with some embodiments.

In the chip package structure 1600, the underfill layer 130 is not formed, which reduces the cost and the process time for manufacturing the chip package structure 1600, in accordance with some embodiments.

The underfill layer 170 extends across the buffer structures 162, in accordance with some embodiments. Specifically, the underfill layer 170 extends from the bottom of the chip package P, across the buffer structures 162, into a peripheral region 165p of the wiring substrate 160, in accordance with some embodiments. The peripheral region 165p continuously surrounds an entire central region 165c of the wiring substrate 160, in accordance with some embodiments. The chip package P and the buffer structures 162 are in the central region 165c, in accordance with some embodiments.

Processes and materials for forming the chip package structures 200, 300, 400, 500, 600, 700, 800, 900, 1000, 1100, 1200, 1300, 1400, 1500, and 1600 may be similar to, or the same as, those for forming the chip package structure 100 of FIG. 1H described above.

In accordance with some embodiments, chip package structures and methods for forming the same are provided. The methods (for forming the chip package structure) form buffer structures in a wiring substrate and dispose a chip package over the wiring substrate. The chip package has corner portions overlapping the buffer structures thereunder. The stress resulting from the coefficient of thermal expansion mismatch (between chip structures of the chip package and the wiring substrate) tends to concentrate around the corner portions, and the buffer structures under the corner portions may buffer the stress to protect the elements close to the corner portions from being damaged by the stress.

In accordance with some embodiments, a method for forming a chip package structure is provided. The method includes removing a first portion of a substrate to form a first recess in the substrate. The method includes forming a buffer structure in the first recess. A first Young's modulus of the buffer structure is less than a second Young's modulus of the substrate. The method includes forming a first wiring structure over the buffer structure and the substrate. The first wiring structure includes a first dielectric structure and a first wiring layer in the first dielectric structure. The method includes bonding a chip package to the first wiring structure. The chip package has an interposer substrate and a chip structure over the interposer substrate, and a first corner of the interposer substrate and a second corner of the chip structure both overlap the buffer structure in a top view of the chip package and the buffer structure.

In accordance with some embodiments, a chip package structure is provided. The chip package structure includes a substrate. The chip package structure includes a buffer structure penetrating into the substrate. A first Young's modulus of the buffer structure is less than a second Young's modulus of the substrate. The chip package structure includes a first wiring structure over the buffer structure and the substrate. The first wiring structure includes a first dielectric structure and a first wiring layer in the first dielectric structure. The chip package structure includes a chip package bonded to the first wiring structure. The chip package has an interposer substrate and a chip structure over the interposer substrate, and a first corner of the interposer substrate and a second corner of the chip structure both overlap the buffer structure in a top view of the chip package and the buffer structure.

In accordance with some embodiments, a chip package structure is provided. The chip package structure includes a substrate. The chip package structure includes a buffer structure passing through the substrate. The buffer structure is softer than the substrate. The chip package structure includes a first wiring structure over the buffer structure and the substrate. The first wiring structure comprises a first dielectric structure and a first wiring layer in the first dielectric structure. The chip package structure includes a chip package bonded to the first wiring structure. The chip package has a corner portion overlapping the buffer structure in a top view of the chip package and the buffer structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a chip package structure, comprising:
   removing a first portion of a substrate to form a first recess in the substrate;
   forming a buffer structure in the first recess, wherein a first Young's modulus of the buffer structure is less than a second Young's modulus of the substrate;
   forming a first wiring structure over the buffer structure and the substrate, wherein the first wiring structure comprises a first dielectric structure and a first wiring layer in the first dielectric structure; and
   bonding a chip package to the first wiring structure, wherein the chip package has an interposer substrate and a chip structure over the interposer substrate, and a first corner of the interposer substrate and a second corner of the chip structure overlap the buffer structure in a top view of the chip package and the buffer structure.

2. The method for forming the chip package structure as claimed in claim 1, wherein the buffer structure continuously extends across the first corner of the interposer substrate and the second corner of the chip structure.

3. The method for forming the chip package structure as claimed in claim 1, wherein the first corner is between a first sidewall and a second sidewall of the interposer substrate, the second corner is between a third sidewall and a fourth sidewall of the chip structure, and the buffer structure extends across the first sidewall, the second sidewall, the third sidewall, and the fourth sidewall in the top view.

4. The method for forming the chip package structure as claimed in claim 1, wherein the buffer structure passes through the substrate.

5. The method for forming the chip package structure as claimed in claim 1, wherein the buffer structure protrudes from the substrate.

6. The method for forming the chip package structure as claimed in claim 1, further comprising:
   before removing the first portion of the substrate, forming a second wiring structure over the substrate, wherein the second wiring structure comprises a second dielectric structure and a second wiring layer in the second dielectric structure,
   the removing of the first portion of the substrate further comprises removing a second portion of the second wiring structure to form a second recess in the second wiring structure, the second recess communicates with the first recess, the buffer structure is further formed in the second recess, and the buffer structure passes through the second wiring structure.

7. The method for forming the chip package structure as claimed in claim 1, wherein the buffer structure is between the first wiring structure and a lower portion of the substrate.

8. The method for forming the chip package structure as claimed in claim 1, wherein the forming of the buffer structure in the first recess comprises:
   disposing a block structure in the first recess, wherein a gap is between the block structure and an inner wall of the first recess; and
   forming a filling layer in the gap, wherein the block structure and the filling layer together form the buffer structure.

9. The method for forming the chip package structure as claimed in claim 8, wherein the forming of the filling layer in the gap further comprises:
   forming the filling layer over the block structure.

10. The method for forming the chip package structure as claimed in claim 1, wherein the substrate comprises a second dielectric structure and a second wiring layer in the second dielectric structure, the first recess is formed in the second dielectric structure, and the first Young's modulus of the buffer structure is less than a third Young's modulus of the second dielectric structure.

11. The method for forming the chip package structure as claimed in claim 1, further comprising:
   removing a second portion of the substrate to form a first through hole in the substrate during removing the first portion of the substrate, wherein the first recess is wider than the first through hole; and
   forming a conductive via structure in the first through hole before forming the first wiring structure over the buffer structure and the substrate, wherein the conductive via structure is electrically connected to the first wiring layer of the first wiring structure.

12. The method for forming the chip package structure as claimed in claim 11, wherein the conductive via structure has a second through hole, and the forming of the buffer structure in the first recess comprises:
   forming a buffer layer in the first recess and the second through hole, wherein the buffer layer in the first recess forms the buffer structure, and the buffer layer in the second through hole forms a filling plug.

13. A method for forming a chip package structure, comprising:
   removing a portion of a substrate to form a recess in the substrate;
   forming a buffer structure in the recess, wherein the buffer structure is softer than the substrate, and the forming of the buffer structure in the recess comprises:
   disposing a block structure in the recess, wherein a gap is between the block structure and an inner wall of the recess; and
   forming a filling layer in the gap, wherein the block structure and the filling layer together form the buffer structure, and the filling layer is thinner than the block structure; and
   bonding a chip package to the substrate, wherein the chip package has a corner, and the corner overlaps the buffer structure in a top view of the chip package and the buffer structure.

14. The method for forming the chip package structure as claimed in claim 13, wherein a first top surface of the buffer structure is substantially level with a second top surface of the substrate.

15. The method for forming the chip package structure as claimed in claim 14, wherein a first bottom surface of the buffer structure is substantially level with a second bottom surface of the substrate.

16. The method for forming the chip package structure as claimed in claim 13, wherein the filling layer is made of a first material having a first Young's modulus, the substrate is made of a second material having a second Young's modulus, and the first Young's modulus is less than the second Young's modulus.

17. A method for forming a chip package structure, comprising:
   forming a buffer structure in a substrate, wherein the buffer structure passes through the substrate, an end portion of the buffer structure protrudes from a surface of the substrate, and a first rigidity of the buffer structure is less than a second rigidity of the substrate; and
   bonding a chip package to the substrate, wherein the chip package has a corner, and the corner overlaps the buffer structure in a top view of the chip package and the buffer structure.

18. The method for forming the chip package structure as claimed in claim 17, wherein the end portion of the buffer structure has a convex curved surface.

19. The method for forming the chip package structure as claimed in claim 18, wherein the convex curved surface faces the corner of the chip package.

20. The method for forming the chip package structure as claimed in claim 17, wherein the end portion of the buffer structure covers a portion of the surface of the substrate.

* * * * *